(12) United States Patent
Amari

(10) Patent No.: US 12,439,630 B2
(45) Date of Patent: Oct. 7, 2025

(54) SEMICONDUCTOR COMPONENT AND MANUFACTURING METHOD THEREOF

(71) Applicant: Sony Group Corporation, Tokyo (JP)

(72) Inventor: Koichi Amari, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 0 days.

(21) Appl. No.: 18/506,567

(22) Filed: Nov. 10, 2023

(65) Prior Publication Data

US 2024/0088290 A1   Mar. 14, 2024

Related U.S. Application Data

(63) Continuation of application No. 17/329,393, filed on May 25, 2021, now Pat. No. 11,848,380, which is a (Continued)

(30) Foreign Application Priority Data

Dec. 28, 2009   (JP) .................................. 2009-298319

(51) Int. Cl.
*H10D 30/60*   (2025.01)
*H10D 30/01*   (2025.01)
(Continued)

(52) U.S. Cl.
CPC ....... *H10D 30/608* (2025.01); *H10D 30/0225* (2025.01); *H10D 30/025* (2025.01);
(Continued)

(58) Field of Classification Search
CPC ............. H01L 29/7834; H01L 29/1037; H01L 29/4236; H01L 29/66545; H01L 29/66583;
(Continued)

(56) References Cited

U.S. PATENT DOCUMENTS 6,093,947 A      7/2000  Hanafi et al.
6,127,233 A  *  10/2000  Rodder ................ H10D 62/151
                                                                   438/300

(Continued)

FOREIGN PATENT DOCUMENTS

CN        101320728      12/2008
JP        62-126675        6/1987
(Continued)

*Primary Examiner* — Edward Chin
(74) *Attorney, Agent, or Firm* — Michael Best & Friedrich LLP

(57) ABSTRACT

A semiconductor component including: a semiconductor substrate; and a semiconductor device provided thereon, the device being a field-effect transistor that includes: a gate insulating film provided on the substrate; a gate electrode provided via the film; and a pair of source-drain regions provided to sandwich the electrode, the substrate including a patterned surface in a portion where the electrode is provided, the patterned surface of the substrate including a raised portion where the film is formed to cover a surface that lies on the same plane as a surface of the pair of source-drain regions, and the electrode is formed on a top surface of the film, and the patterned surface of the substrate including a recessed portion where the film is formed to cover surfaces of a groove formed toward the interior than the surface of the pair of source-drain regions, and the electrode is formed so as to fill the groove provided with the film.

7 Claims, 24 Drawing Sheets

Related U.S. Application Data continuation of application No. 16/899,157, filed on Jun. 11, 2020, now Pat. No. 11,043,590, which is a continuation of application No. 15/956,254, filed on Apr. 18, 2018, now Pat. No. 10,727,335, which is a continuation of application No. 15/658,950, filed on Jul. 25, 2017, now Pat. No. 9,991,383, which is a continuation of application No. 15/371,826, filed on Dec. 7, 2016, now Pat. No. 9,748,384, which is a continuation of application No. 14/573,771, filed on Dec. 17, 2014, now Pat. No. 9,548,360, which is a continuation of application No. 12/967,857, filed on Dec. 14, 2010, now Pat. No. 8,937,349.

(51) Int. Cl.
  *H10D 30/63* (2025.01)
  *H10D 30/69* (2025.01)
  *H10D 62/17* (2025.01)
  *H10D 64/01* (2025.01)
  *H10D 64/27* (2025.01)

(52) U.S. Cl.
  CPC ........... *H10D 30/63* (2025.01); *H10D 30/792* (2025.01); *H10D 62/292* (2025.01); *H10D 64/017* (2025.01); *H10D 64/027* (2025.01); *H10D 64/513* (2025.01)

(58) Field of Classification Search
  CPC ......... H01L 29/66621; H01L 29/66666; H01L 29/7827; H01L 29/7843
  See application file for complete search history.

(56) References Cited

U.S. PATENT DOCUMENTS

| | | | |
|---|---|---|---|
| 6,187,641 B1* | 2/2001 | Rodder | H10D 62/822 257/E29.255 |
| 6,252,272 B1 | 6/2001 | Watanabe et al. | |
| 6,255,679 B1 | 7/2001 | Akiba | |
| 6,452,231 B1 | 9/2002 | Nakagawa et al. | |
| 6,465,842 B2* | 10/2002 | Nishinohara | H10D 64/027 257/E21.429 |
| 6,534,352 B1 | 3/2003 | Kim | |
| 6,683,362 B1 | 1/2004 | D Kenneth et al. | |
| 6,744,111 B1 | 6/2004 | Wu | |
| 6,853,031 B2* | 2/2005 | Liao | H10D 30/026 257/334 |
| 6,854,330 B2 | 2/2005 | Potter | |
| 7,059,190 B2 | 6/2006 | Sakai | |
| 7,144,767 B2 | 12/2006 | Chidambarrao et al. | |
| 7,161,218 B2 | 1/2007 | Bertin et al. | |
| 7,180,019 B1 | 2/2007 | Chiou | |
| 7,391,068 B2 | 6/2008 | Kito et al. | |
| 7,449,355 B2 | 11/2008 | Lutz | |
| 7,514,760 B1 | 4/2009 | Quevy | |
| 7,642,147 B1 | 1/2010 | Kanakasabapathy | |
| 7,736,931 B1 | 6/2010 | Guo | |
| 8,098,870 B2 | 1/2012 | Kok | |
| 8,119,473 B2 | 2/2012 | Huang et al. | |
| 8,298,875 B1 | 10/2012 | Or-Bach et al. | |
| 8,481,386 B2 | 7/2013 | Liu et al. | |
| 8,552,492 B2 | 10/2013 | Sanada et al. | |
| 8,587,077 B2 | 11/2013 | Chen | |
| 8,692,337 B2 | 4/2014 | Berthelot | |
| 9,725,310 B2 | 8/2017 | Cheng | |
| 2001/0045597 A1* | 11/2001 | Nishinohara | H10D 64/017 257/E29.267 |
| 2002/0011612 A1 | 1/2002 | Hieda | |
| 2004/0026736 A1 | 2/2004 | Grupp et al. | |
| 2004/0206990 A1* | 10/2004 | Liao | H10D 30/026 257/E29.022 |
| 2004/0245586 A1 | 12/2004 | Partridge | |
| 2005/0054166 A1 | 3/2005 | Hsu et al. | |
| 2005/0148137 A1* | 7/2005 | Brask | H10D 84/038 257/E29.151 |
| 2005/0151210 A1 | 7/2005 | Li et al. | |
| 2005/0285204 A1* | 12/2005 | Kim | H10D 30/62 257/401 |
| 2006/0038242 A1 | 2/2006 | Hsu et al. | |
| 2006/0125121 A1 | 6/2006 | Ko et al. | |
| 2006/0145274 A1 | 7/2006 | Chidambarrao et al. | |
| 2006/0163679 A1 | 7/2006 | LaFond | |
| 2006/0284270 A1* | 12/2006 | Lee | H10D 30/0323 257/E21.415 |
| 2007/0034965 A1 | 2/2007 | Jung et al. | |
| 2007/0108514 A1 | 5/2007 | Inoue et al. | |
| 2007/0158767 A1 | 7/2007 | Sinclair | |
| 2007/0181913 A1 | 8/2007 | Li | |
| 2008/0105920 A1 | 5/2008 | Hirano et al. | |
| 2008/0119000 A1 | 5/2008 | Yel | |
| 2008/0173934 A1 | 7/2008 | Lee et al. | |
| 2010/0005884 A1 | 1/2010 | Weinberg | |
| 2010/0006972 A1 | 1/2010 | La Tulipe, Jr. | |
| 2010/0148341 A1 | 6/2010 | Fuji | |
| 2010/0149625 A1 | 6/2010 | Lu | |
| 2010/0171153 A1 | 7/2010 | Yang | |
| 2010/0176466 A1 | 7/2010 | Fujii | |
| 2010/0240215 A1 | 9/2010 | Huang | |
| 2010/0244141 A1 | 9/2010 | Beyer et al. | |
| 2010/0251818 A1 | 10/2010 | Ge | |
| 2010/0289080 A1 | 11/2010 | Wei et al. | |
| 2011/0037160 A1 | 2/2011 | Hsu | |
| 2011/0042758 A1 | 2/2011 | Kikuchi et al. | |
| 2011/0049713 A1 | 3/2011 | Frohberg et al. | |
| 2011/0156136 A1* | 6/2011 | Amari | H10D 30/608 257/E21.409 |
| 2011/0272796 A1 | 11/2011 | Eaton | |
| 2012/0061774 A1 | 3/2012 | Morita et al. | |
| 2012/0086075 A1 | 4/2012 | Huang et al. | |
| 2012/0119311 A1 | 5/2012 | Akhlaghi Esfahany | |
| 2012/0187460 A1 | 7/2012 | Lavoie et al. | |
| 2012/0264286 A1 | 10/2012 | Yeo | |
| 2012/0286370 A1 | 11/2012 | Li et al. | |
| 2013/0241008 A1 | 9/2013 | Choi | |
| 2014/0042562 A1 | 2/2014 | Chu | |
| 2014/0261960 A1 | 9/2014 | Lin | |
| 2015/0064897 A1 | 3/2015 | Baiocco | |
| 2015/0097238 A1 | 4/2015 | Zhang | |
| 2015/0108589 A1 | 4/2015 | Cheng et al. | |
| 2015/0206953 A1 | 7/2015 | Basker | |
| 2016/0358826 A1 | 12/2016 | Niimi | |
| 2017/0082567 A1 | 3/2017 | Brien | |
| 2017/0236759 A1 | 8/2017 | Jagannathan | |
| 2018/0240873 A1 | 8/2018 | Cheng | |

FOREIGN PATENT DOCUMENTS

| | | | |
|---|---|---|---|
| JP | 02-022868 | 1/1990 | |
| JP | 2000-091571 | 3/2000 | |
| JP | 3405681 B2 * | 5/2003 | ......... H01L 29/4236 |
| JP | 2004-319704 | 11/2004 | |
| JP | 2007-005568 | 1/2007 | |
| JP | 2008-193060 | 8/2008 | |
| JP | 2009-094571 | 4/2009 | |
| JP | 50-006287 S | 8/2012 | |

* cited by examiner (1) TRANSISTOR FORMING STEP (1) TRANSISTOR FORMING STEP (2) PLANARIZING FILM FORMING STEP (2) PLANARIZING FILM FORMING STEP (3) DUMMY GATE ELECTRODE AND DUMMY GATE INSULATING FILM REMOVING STEP (3) DUMMY GATE ELECTRODE AND DUMMY GATE INSULATING FILM REMOVING STEP (4) GROOVE FORMING STEP (4) GROOVE FORMING STEP (5) HIGH-DIELECTRIC FILM FORMING STEP (5) HIGH-DIELECTRIC FILM FORMING STEP (6) METAL FILM FORMING STEP (6) METAL FILM FORMING STEP

<SECOND EMBODIMENT>

<VARIATION OF SECOND EMBODIMENT>

100ba

SEMICONDUCTOR COMPONENT AND MANUFACTURING METHOD THEREOF

RELATED APPLICATION DATA

This application is a continuation of U.S. patent application Ser. No. 17/329,393 filed May 25, 2021, which is a continuation of U.S. patent application Ser. No. 16/899,157 filed Jun. 1, 2020, now U.S. Pat. No. 11,043,590 issued Jun. 22, 2021, which is a continuation of U.S. patent application Ser. No. 15/956,254 filed Apr. 18, 2018, now U.S. Pat. No. 10,727,335 issued Jul. 28, 2020, which is a continuation of U.S. patent application Ser. No. 15/658,950 filed Jul. 25, 2017, now U.S. Pat. No. 9,991,383 issued Jun. 5, 2018, which is a continuation of U.S. patent application Ser. No. 15/371,826 filed Dec. 7, 2016, now U.S. Pat. No. 9,748,384 issued Aug. 29, 2017, which is a continuation of U.S. patent application Ser. No. 14/573,771 filed Dec. 17, 2014, now U.S. Pat. No. 9,548,360 issued Jan. 17, 2017, which is a continuation of U.S. patent application Ser. No. 12/967,857 filed Dec. 14, 2010, now U.S. Pat. No. 8,937,349 issued Jan. 20, 2015, the entireties of which are incorporated herein by reference to the extent permitted by law. The present application claims the benefit of priority to Japanese Patent Application No. JP 2009-298319 filed on Dec. 28, 2009 in the Japan Patent Office, the entirety of which is incorporated by reference herein to the extent permitted by law.

BACKGROUND OF THE INVENTION

1. Field of the Invention

The present invention relates to semiconductor components, and manufacturing methods thereof. The invention particularly relates to semiconductor components that include semiconductor devices, for example, field-effect transistors (FET), on a semiconductor substrate, and methods for manufacturing such semiconductor components.

2. Description of the Related Art

In semiconductor components, for example, the semiconductor device FET is formed on a semiconductor substrate. For higher integration, there is a need for miniaturization of such semiconductor devices. However, in the realm of FETs, miniaturization of the semiconductor devices may lead to decreased drain current amounts and a corresponding decrease in operation speed.

As a countermeasure against such drawbacks, for example, JP-A-2007-5568 and JP-A-2009-94571 propose increasing the effective channel width by providing a gate insulating film and a gate electrode on a patterned surface formed along the width direction of the channel.

SUMMARY OF THE INVENTION

FIG. 21 to FIG. 24 are diagrams illustrating a semiconductor component 100J.

FIG. 21 illustrates a top surface of the semiconductor component 100J. FIG. 22 to FIG. 24 show cross sections of the semiconductor component 100J. Specifically, FIG. 22 shows a cross section at X1-X2 of FIG. 21, FIG. 23 a cross section at Y1-Y2 of FIG. 21, and FIG. 24 a cross section at Y3-Y4 of FIG. 21.

As illustrated in FIG. 21, the semiconductor component 100J includes a semiconductor device 110J provided on a semiconductor substrate 101 in a portion parted by an element isolation region 200.

As illustrated in FIG. 21, the semiconductor device 110J includes a gate electrode 111$gj$, and a pair of source-drain regions 112$sj$ and 112$dj$. In other words, the semiconductor device 110J is a field-effect transistor.

As illustrated in FIG. 22, the gate electrode 111$gj$ forming the semiconductor device 110J is formed on the surface of the semiconductor substrate 101J, specifically, on a patterned surface formed along the width direction x of a channel 101$cj$, via a gate insulating film 111$zj$.

Specifically, as illustrated in FIG. 23, the gate electrode 111$gj$ formed on the patterned surface of the semiconductor substrate 101J is sandwiched between the source-drain regions 112$sj$ and 112$dj$ in raised portions CVj. In recessed portions TRj, as illustrated in FIG. 24, the gate electrode 111$gj$ is sandwiched between the source-drain regions 112$sj$ and 112$dj$ inside the recessed portions TRj. As illustrated in FIG. 23 and FIG. 24, the gate electrode 111$gj$ has the same cross sectional shape and the same channel length L12 and L34 in the raised portions CVj and the recessed portions TRj. On the surface of the semiconductor substrate 101J, side walls SW are provided on the both sides of the gate electrode 111$gj$.

The source-drain regions 112$sj$ and 112$dj$ forming the semiconductor device 110J include, as illustrated in FIG. 23 and FIG. 24, low-concentration impurity regions 112Ls and 112Ld, respectively, provided beneath the side walls SW. The source-drain regions 112$sj$ and 112$dj$ also include high-concentration impurity regions 112Hs and 112Hd, respectively, provided on the both sides of the low-concentration impurity regions 112Ls and 112Ld.

For the formation of the semiconductor device 110J, the semiconductor substrate is shaped into a pattern on the surface along the width direction of the channel 101$cj$. The gate insulating film 111$zj$ and the gate electrode 111$gj$ are sequentially provided on this patterned surface.

This is followed by formation of the source-drain regions 112$sj$ and 112$dj$. Formation of the source-drain regions 112$sj$ and 112$dj$ proceeds by ion implantation of impurities into the semiconductor substrate 101 using the gate electrode 111$gj$ as a mask. As a result, the low-concentration impurity regions 112Ls and 112Ld are formed. Then, after forming the side walls SW, the high-concentration impurity regions 112Hs and 112Hd are formed by ion implantation of impurities into the semiconductor substrate 101 using the gate electrode 111$gj$ and the side walls SW as a mask.

For reasons relating to the alignment of the gate electrode 111$gj$ for fabrication, the patterned surface needs to have a wide dimension in the direction y along the channel length. Specifically, as illustrated in FIG. 21, the region defined by the width of the gate electrode 111$gj$ (the distance defined by the y direction) is not sufficient, and the patterned surface requires a wider width in the channel length direction y, as indicated by region TAj surrounded by dotted lines in FIG. 21.

Because the surfaces of the source-drain regions 112$sj$ and 112$dj$ are also patterned, difficulties may arise in forming source and drain electrodes (not illustrated). Further difficulties may arise in miniaturizing the source and drain electrodes in the channel length direction y.

Further, because the source-drain regions 112$sj$ and 112$dj$ are formed after forming the patterned surface, electric field may diffuse in the recessed portions TRj, and cause the off current to increase more in the recessed portions TRj than in the raised portions CVj. Defects involving decrease in S factor may also occur.

As described above, it has been difficult to improve semiconductor device characteristics while realizing miniaturization of the semiconductor device.

Accordingly, there is a need for a semiconductor component and a manufacturing method thereof with which semiconductor device characteristics can be improved while realizing miniaturization of the semiconductor device.

According to an embodiment of the present invention, there is provided a semiconductor component that includes: a semiconductor substrate; and a semiconductor device provided on the semiconductor substrate, the semiconductor device being a field-effect transistor that includes: a gate insulating film provided on the semiconductor substrate; a gate electrode provided via the gate insulating film; and a pair of source-drain regions provided to sandwich the gate electrode on the semiconductor substrate, the semiconductor substrate including a patterned surface in a portion where the gate electrode is provided, the patterned surface of the semiconductor substrate including a raised portion where the gate insulating film is formed to cover a surface that lies on the same plane as a surface of the pair of source-drain regions, and where the gate electrode is formed on a top surface of the gate insulating film, and the patterned surface of the semiconductor substrate including a recessed portion where the gate insulating film is formed to cover surfaces of a groove formed toward the interior than the surface of the pair of source-drain regions, and where the gate electrode is formed so as to fill the groove provided with the gate insulating film.

It is preferable that the groove on the patterned surface of the semiconductor substrate have a side surface along a depth direction of the semiconductor substrate.

It is preferable that the groove on the patterned surface of the semiconductor substrate have a surface slanted with respect to a depth direction of the semiconductor substrate.

It is preferable that the slanted surface of the groove on the patterned surface of the semiconductor substrate lie on a (111) plane.

It is preferable that the pair of source-drain regions have the same shape for the raised portion and the recessed portion on the patterned surface of the semiconductor substrate.

It is preferable that the pair of source-drain regions have a flat top surface, and the same depth in the semiconductor substrate in the raised portion and the recessed portion on the patterned surface of the semiconductor substrate.

According to another embodiment of the present invention, there is provided a method for manufacturing a semiconductor component. The method including a semiconductor device forming step of forming a field-effect transistor semiconductor device that includes a gate insulating film provided on a semiconductor substrate, a gate electrode provided via the gate insulating film, and a pair of source-drain regions provided to sandwich the gate electrode on the semiconductor substrate, the semiconductor device forming step forming a patterned surface in a portion of the semiconductor substrate where the gate electrode is provided, wherein, in a raised portion on the patterned surface of the semiconductor substrate, the gate insulating film is formed so as to cover a surface that lies on the same plane as a surface of the pair of source-drain regions, and the gate electrode is formed on a top surface of the gate insulating film, and wherein, in a recessed portion on the patterned surface of the semiconductor substrate, the gate insulating film is formed so as to cover surfaces of a groove formed toward the interior than the surface of the pair of source-drain regions, and the gate electrode is formed so as to fill the groove provided with the gate insulating film.

It is preferable that the semiconductor device forming step include: the first step of forming a dummy gate electrode via a dummy gate insulating film on a surface of the semiconductor substrate in a portion where the gate insulating film and the gate electrode of the semiconductor device are to be formed, and forming the pair of source-drain regions of the semiconductor device so as to sandwich the dummy gate electrode; the second step of forming a planarizing film on the surface of the semiconductor substrate so as to expose a top surface of the dummy gate electrode, and to cover a top surface of the pair of source-drain regions; the third step of removing the dummy gate electrode and the dummy gate insulating film so as to expose the semiconductor substrate on the surface from which the dummy gate electrode and the dummy gate insulating film are removed, and to form an opening in the exposed surface portion; the fourth step of etching the opening surface of the semiconductor substrate to provide the groove and form the patterned surface on the semiconductor substrate; the fifth step of depositing an insulating film over the patterned surface of the semiconductor substrate so as to form the gate insulating film; and the sixth step of depositing a conductive film over the gate insulating film formed on the patterned surface so as to form the gate electrode.

It is preferable that the pair of source-drain regions be formed in the same shape for the raised portion and the recessed portion on the patterned surface of the semiconductor substrate.

In the embodiments of the present invention, the semiconductor substrate has the patterned surface formed in a portion provided with the gate electrode. In the raised portion on the patterned surface of the semiconductor substrate, the gate insulating film is formed so as to cover a surface that lies on the same plane as the surface of the pair of source-drain regions in the semiconductor substrate, and the gate electrode is formed on the top surface of the gate insulating film. In the recessed portion on the patterned surface of the semiconductor substrate, the gate insulating film is formed so as to cover surfaces of the groove formed toward the interior than the surface of the pair of source-drain regions in the semiconductor substrate, and the gate electrode is formed so as to fill the groove provided with the gate insulating film.

The present invention can advantageously provide a semiconductor component and a manufacturing method thereof with which semiconductor device characteristics can be improved, and miniaturization of the semiconductor device can be realized with ease.

DESCRIPTION OF THE PREFERRED EMBODIMENTS

The following describes embodiments of the present invention.

Descriptions will be given in the following order.
1. First Embodiment (rectangular grooves)
2. Second Embodiment (tapered grooves)
3. Other

1. First Embodiment (A) Device Configuration

FIG. 1 to FIG. 4 are diagrams illustrating a semiconductor component 100 according to First Embodiment of the present invention.

Figure 1:
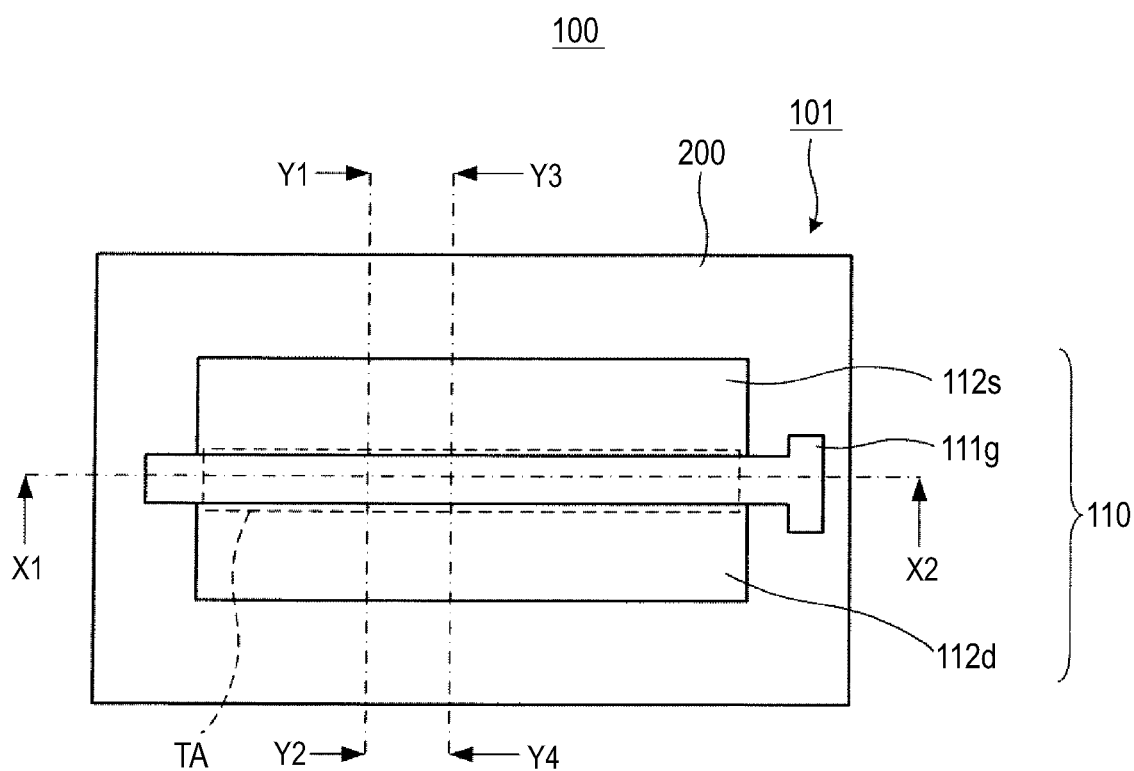
FIG. 1 is a diagram illustrating a semiconductor component according to First Embodiment of the present invention.
Figure 1:
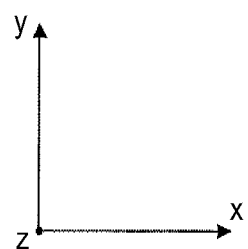
Figure 2:
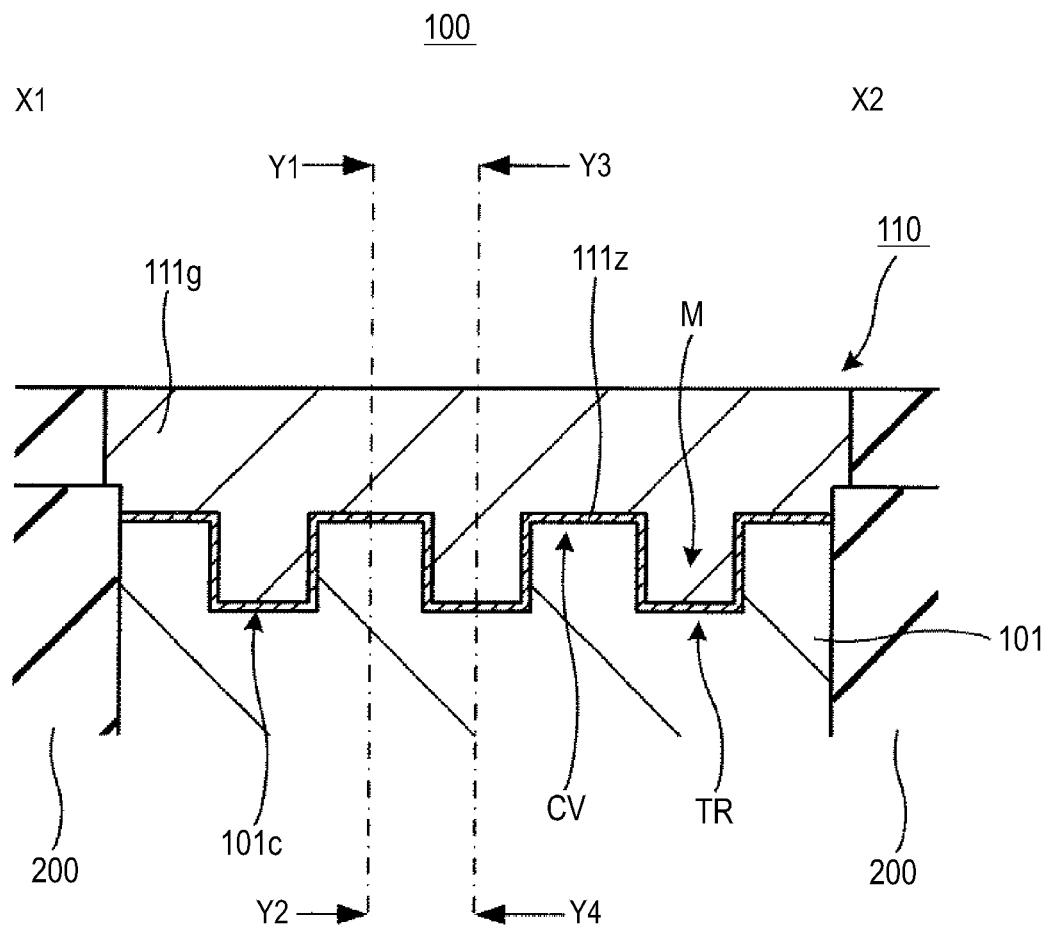
FIG. 2 is a diagram illustrating the semiconductor component according to First Embodiment of the present invention.
Figure 2:
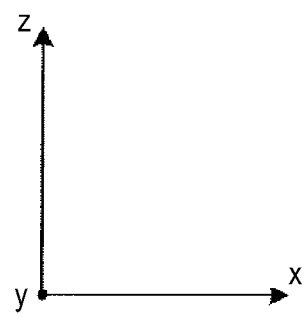
Figure 3:
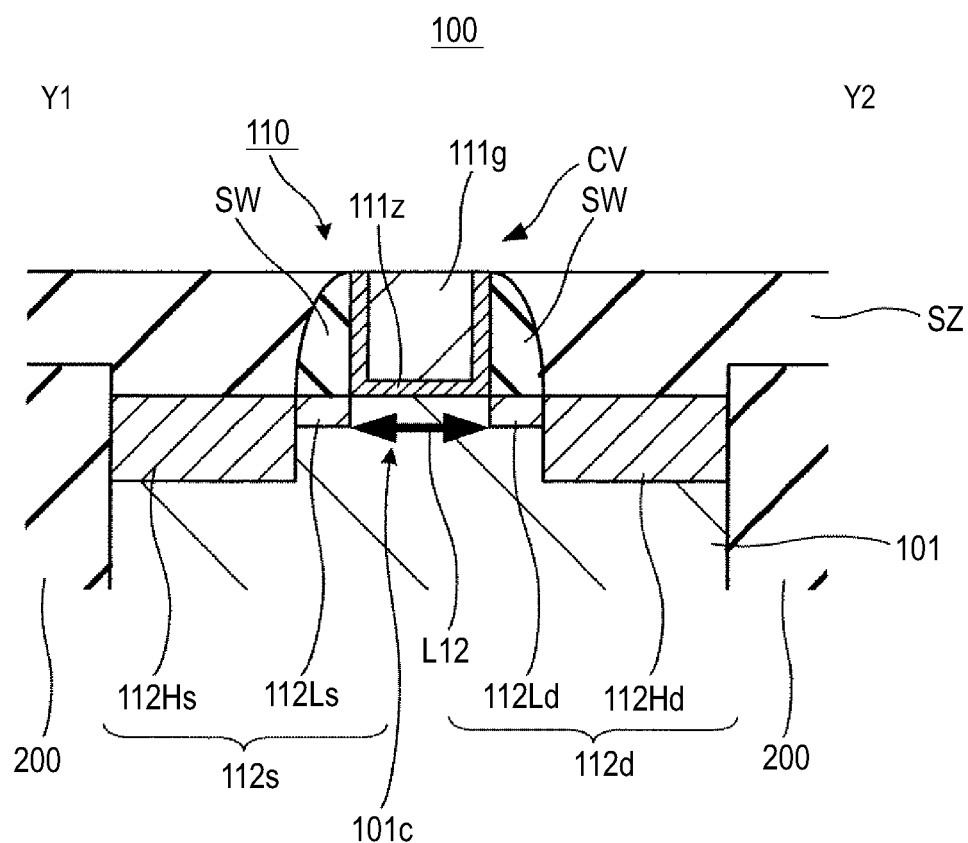
FIG. 3 is a diagram illustrating the semiconductor component according to First Embodiment of the present invention.
Figure 3:
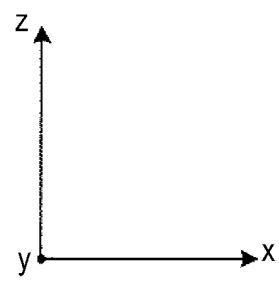
Figure 4:
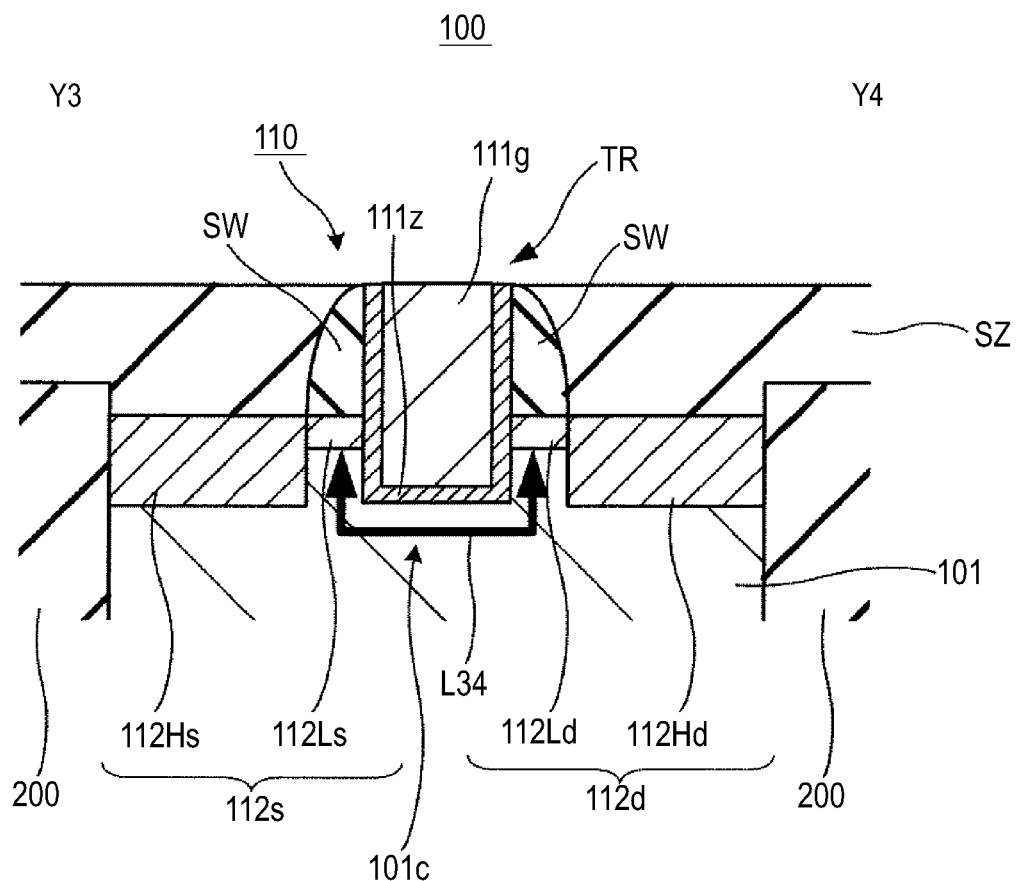
FIG. 4 is a diagram illustrating the semiconductor component according to First Embodiment of the present invention.
Figure 4:
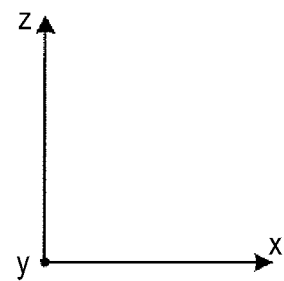

FIG. 1 shows a top surface of the semiconductor component 100. FIG. 2 to FIG. 4 are cross sections of the semiconductor component 100. Specifically, FIG. 2 is a cross section perpendicular to the plane of the paper at X1-X2 of FIG. 1. FIG. 3 is a cross section perpendicular to the plane of the paper at Y1-Y2 of FIG. 1. FIG. 4 is a cross section perpendicular to the plane of the paper at Y3-Y4 of FIG. 1.

As illustrated in FIG. 1 to FIG. 4, the semiconductor component 100 includes a semiconductor substrate 101. The semiconductor substrate 101 is, for example, a monocrystalline silicon substrate, and includes an element isolation region 200 of insulating material such as silicon oxide. A semiconductor device 110 is provided on the semiconductor substrate 101 in a portion parted by the element isolation region 200.

As illustrated in FIG. 1, the semiconductor device 110 is an FET, and includes a gate electrode 111g and a pair of source-drain regions 112s and 112d.

As illustrated in FIG. 1, the gate electrode 111g forming the semiconductor device 110 is formed so as to be sandwiched between the source-drain regions 112s and 112d on a plane of the semiconductor substrate 101 (xy plane). Further, the gate electrode 111g extends in the x direction perpendicular to the channel length direction y along which the source-drain regions 112s and 112d are disposed. In other words, the gate electrode 111g is formed so that its longer side is along the channel width direction x.

The gate electrode 111g is formed using conductive materials, including, for example, metallic materials such as Ti, Ru, Hf, Ir, Co, W, Mo, La, Ni, Cu, and Al, and Si compounds and N compounds of these. These conductive materials may be appropriately combined to form the gate electrode 111g. Further, more than one conductive material may be appropriately laminated to form the gate electrode 111g.

As illustrated in FIG. 2, the gate electrode 111g is formed on the surface of the semiconductor substrate 101 via a gate insulating film 111z. The gate insulating film 111z is formed using high-dielectric (High-k) material, for example, such as oxides of metal selected from Al, Y, Zr, La, Hf, and Ta, and oxide silicide, nitride oxide, and oxide nitride silicide.

As illustrated in FIG. 2, the semiconductor substrate 101 has a patterned surface formed along the longitudinal direction x of the gate electrode 111g. The gate electrode 111g is formed so as to cover the patterned surface via the gate insulating film 111z. In the present embodiment, recurrently occurring grooves M of equal pitches are provided in the width direction x of a channel 101c, with the side surfaces situated along the depth direction z of the semiconductor substrate 101. The gate electrode 111g and the gate insulating film 111z are formed on the surfaces of raised portions CV and recessed portions TR of the grooves M.

As illustrated in FIG. 2, the gate electrode 111g formed on the patterned surface has a flat surface, and is thicker in portions corresponding to the recessed portions TR than in portions corresponding to the raised portions CV.

As illustrated in FIG. 3, in the raised portions CV, the gate electrode 111g is sandwiched between the source-drain regions 112s and 112d on the surface of the semiconductor substrate 101. In the recessed portions TR on the surface of the semiconductor substrate 101, as illustrated in FIG. 4, the gate electrode 111g is sandwiched between the source-drain regions 112s and 112d inside the recessed portions TR.

As illustrated in FIG. 3 and FIG. 4, the gate electrode 111g has different cross sectional shapes and different channel lengths L12 and L34 for the raised portions CV and the recessed portions TR.

Specifically, as illustrated in FIG. 3, in the raised portions CV, the gate electrode 111g is formed on the flat, non-recessed surface of the semiconductor substrate 101 via the gate insulating film 111z. Thus, in the raised portions CV, the channel length L12 corresponds to the distance between the source-drain regions 112s and 112d.

In contrast, in the recessed portions TR, the gate insulating film 111z is formed to cover the surfaces of the recessed grooves formed in the depth direction z of the semiconductor substrate 101 from the surface of the semiconductor substrate 101, as illustrated in FIG. 4. The gate electrode 111g fills the grooves provided with the gate insulating film 111z. Thus, in the recessed portions TR, the channel length L34 corresponds to the sum of the distance between the source-drain regions 112s and 112d and the distance of the gate electrode 111g filling the grooves to a depth of the source-drain regions 112s and 112d in the depth direction z.

That is, in the present embodiment, as illustrate in FIG. 3 and FIG. 4, the gate electrode 111g is formed in such a manner that the channel length L34 in the recessed portions TR is longer than the channel length L12 in the raised portions CV.

As illustrated in FIG. 3 and FIG. 4, side walls SW are provided on the side surfaces of the gate electrode 111g, sandwiching the gate electrode 111g on the surface of the semiconductor substrate 101.

As illustrated in FIG. 3 and FIG. 4, the low-concentration impurity regions 112Ls and 112Ld in the source-drain regions 112s and 112d forming the semiconductor device 110J are provided beneath the side walls SW. The low-concentration impurity regions 112Ls and 112Ld are so-called extension regions, and are formed as shallow junction regions at the surface of the semiconductor substrate 101.

As illustrated in FIG. 3 and FIG. 4, the high-concentration impurity regions 112Hs and 112Hd in the source-drain regions 112s and 112d are formed on the both sides of the low-concentration impurity regions 112Ls and 112Ld. The high-concentration impurity regions 112Hs and 112Hd are provided as deeper junction regions than the low-concentration impurity regions 112Ls and 112Ld. The high-concentration impurity regions 112Hs and 112Hd are covered with a silicide film, and are in contact with a source electrode and a drain electrode (neither is illustrated).

In this manner, the semiconductor device 110 forms an FET of so-called an LDD (Lightly Doped Drain) structure.

As illustrated in FIG. 2 to FIG. 4, the semiconductor device 110 is covered with an interlayer insulating film such as a planarizing film SZ.

(B) Manufacturing Method

A manufacturing method of the semiconductor component is described below with regard to relevant portions.

FIG. 5 to FIGS. 16A and 16B are diagrams illustrating relevant portions of the semiconductor component in each step of the manufacturing method according to First Embodiment of the present invention.

As with FIG. 2, FIGS. 5, 7, 9, 11, 13, and 15 are cross sections perpendicular to the plane of the paper at X1-X2 of FIG. 1. Further, as with FIG. 3 or 4, FIGS. 6A and 6B, 8A and 8B, 10A and 10B, 12A and 12B, 14A and 14B, and 16A and 16B are cross sections perpendicular to the plane of the paper at Y1-Y2 or Y3-Y4 of FIG. 1. Specifically, FIGS. 6A, 8A, 10A, 12A, 14A, and 16A are cross sections perpendicular to the plane of the paper at Y1-Y2 of FIG. 1. FIGS. 6B, 8B, 10B, 12B, 14B, and 16B are cross sections perpendicular to the plane of the paper at Y3-Y4 of FIG. 1.

As illustrated in FIG. 5 to FIGS. 16A and 16B step by step, the semiconductor device (FET) 110 is formed by so-called a damascene process in the present embodiment.

(1) Transistor Forming Step

Figure 5:
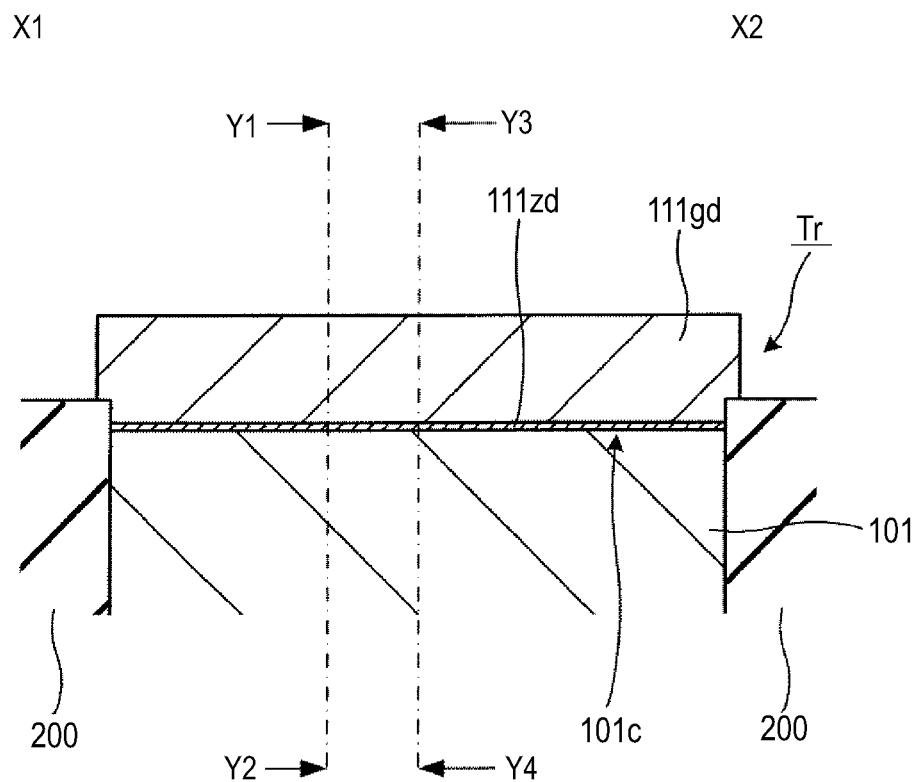
FIG. 5 is a diagram illustrating a relevant portion of the semiconductor component in one of the steps of a manufacturing method according to First Embodiment of the present invention.
Figure 5:
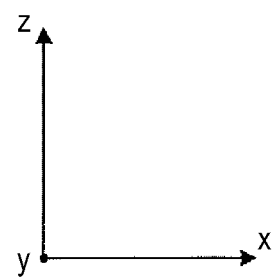
Figure 6A:
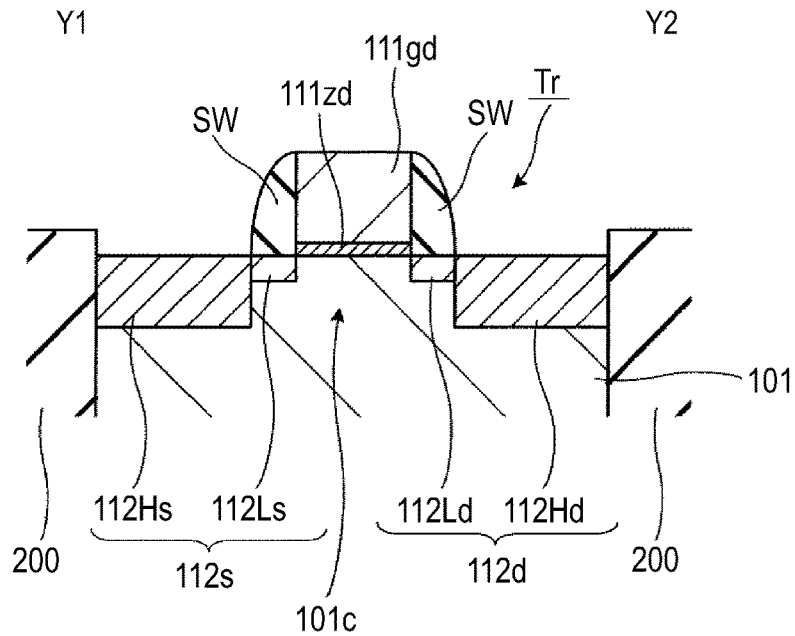
FIGS. 6A and 6B are diagrams illustrating a relevant portion of the semiconductor component in one of the steps of the manufacturing method according to First Embodiment of the present invention.
Figure 6B:
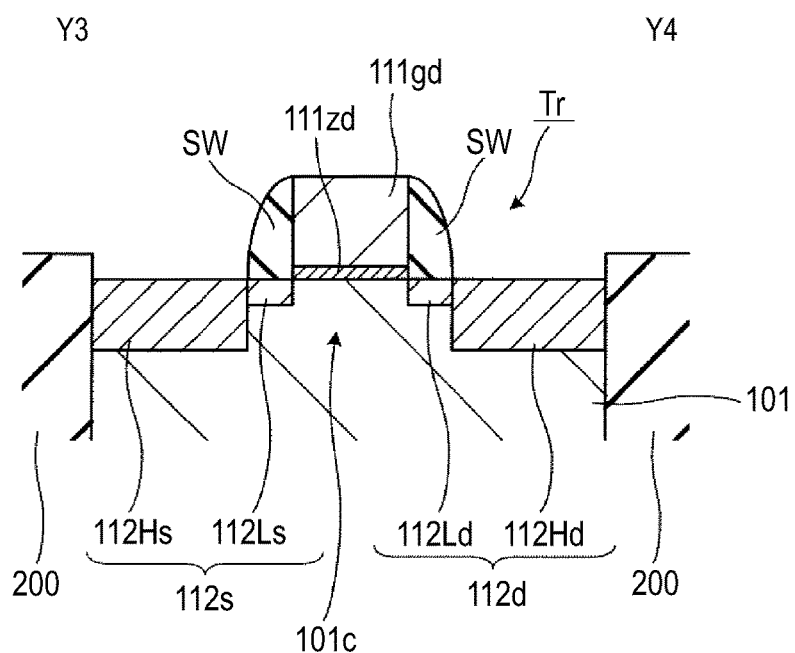

First, the transistor forming step represented in FIG. 5 and FIGS. 6A and 6B is performed for the manufacture of the semiconductor component.

As illustrated in FIG. 5 and FIGS. 6A and 6B, a transistor Tr is formed using an ordinary MOS process in a region of the semiconductor substrate 101 parted by the element isolation region 200. In the present embodiment, the transistor Tr formed on the surface of the semiconductor substrate 101 includes a dummy gate electrode 111gd via a dummy gate insulating film 111zd.

In this step, the dummy gate electrode 111gd is formed via the dummy gate insulating film 111zd on the surface of the semiconductor substrate 101 in a portion where a gate insulating film 111z and a gate electrode 111g of the semiconductor device 110 are to be formed. Further, in this step, the source-drain regions 112s and 112d of the semiconductor device 110 are formed on the both sides of the dummy gate electrode 111gd, prior to forming the gate insulating film 111z and the gate electrode 111g of the semiconductor device 110.

Specifically, first, the element isolation region 200 of an STI (Shallow Trench Isolation) structure is formed on the surface of the semiconductor substrate 101. The surface of the semiconductor substrate 101 is then oxidized to form a protective film of silicon oxide (not illustrated) for the prevention of channeling. For adjustment of threshold value, this is followed by ion implantation of impurities in a region of the semiconductor substrate 101 where the transistor Tr is to be provided. The protective film is removed thereafter.

Thereafter, as illustrated in FIG. 5 and FIGS. 6A and 6B, the dummy gate insulating film 111zd and the dummy gate electrode 111gd are formed.

For example, the surface of the semiconductor substrate 101 is subjected to a thermal oxidation process to deposit a silicon oxide film having a thickness of about 1 to 3 nm (not illustrated). Then, a polysilicon film having a thickness of about 30 to 100 nm (not illustrated) is deposited on the silicon oxide film (not illustrated) using, for example, a CVD method. The polysilicon film (not illustrated) is then patterned to form the dummy gate electrode 111gd. The silicon oxide film (not illustrated) is patterned to form the dummy gate insulating film 111zd.

Thereafter, as illustrated in FIGS. 6A and 6B, the source-drain regions 112s and 112d are formed.

First, as illustrated in FIGS. 6A and 6B, the low-concentration impurity regions 112Ls and 112Ld of the source-drain regions 112s and 112d are formed.

The low-concentration impurity regions 112Ls and 112Ld are formed by ion implantation of impurities on the surface of the semiconductor substrate 101, using the dummy gate electrode 111gd as a mask.

Specifically, n-type impurities such as As and P are injected for the formation of an n-type MOS semiconductor device 110. For p-type MOS, p-type impurities such as B and In are injected.

Then, as illustrated in FIGS. 6A and 6B, the side walls SW are formed.

For the formation of the side walls SW, an insulating film (not illustrated) is deposited so as to cover the dummy gate electrode 111gd on the surface of the semiconductor substrate 101. For example, a silicon nitride film is deposited as the insulating film (not illustrated), using a CVD method. The insulating film (not illustrated) is etched back to provide the side walls SW.

Then, as illustrated in FIGS. 6A and 6B, the high-concentration impurity regions 112Hs and 112Hd of the source-drain regions 112s and 112d are formed.

The high-concentration impurity regions 112Hs and 112Hd are formed by ion implantation of impurities on the surface of the semiconductor substrate 101, using the dummy gate electrode 111gd and the side walls SW as a mask.

Specifically, as in the case of the low-concentration impurity regions 112Ls and 112Ld, n-type impurities such as As and P are injected for n-type MOS. For p-type MOS, p-type impurities such as B and In are injected.

This is followed by a heat treatment to activate the injected impurities, and form the source-drain regions 112s and 112d.

A silicide film (not illustrated) is formed on the surface of the high-concentration impurity regions 112Hs and 112Hd. For example, a silicide film (not illustrated) as the silicide of metals such as Co, Ni, and Pt is formed.

In this manner, the transistor Tr of a different shape from the gate electrode 111g and the gate insulating film 111z of the semiconductor device 110 of FIG. 1 to FIG. 4 is formed in this step. Specifically, as illustrated in FIG. 5 and FIGS. 6A and 6B, the transistor Tr is formed to include the dummy gate electrode 111gd and the dummy gate insulating film 111zd that extend along the width direction x of the channel 101c on the surface (xy plane) of the semiconductor substrate 101, but not along the depth direction z of the semiconductor substrate 101.

(2) Planarizing Film Forming Step

Figure 7:
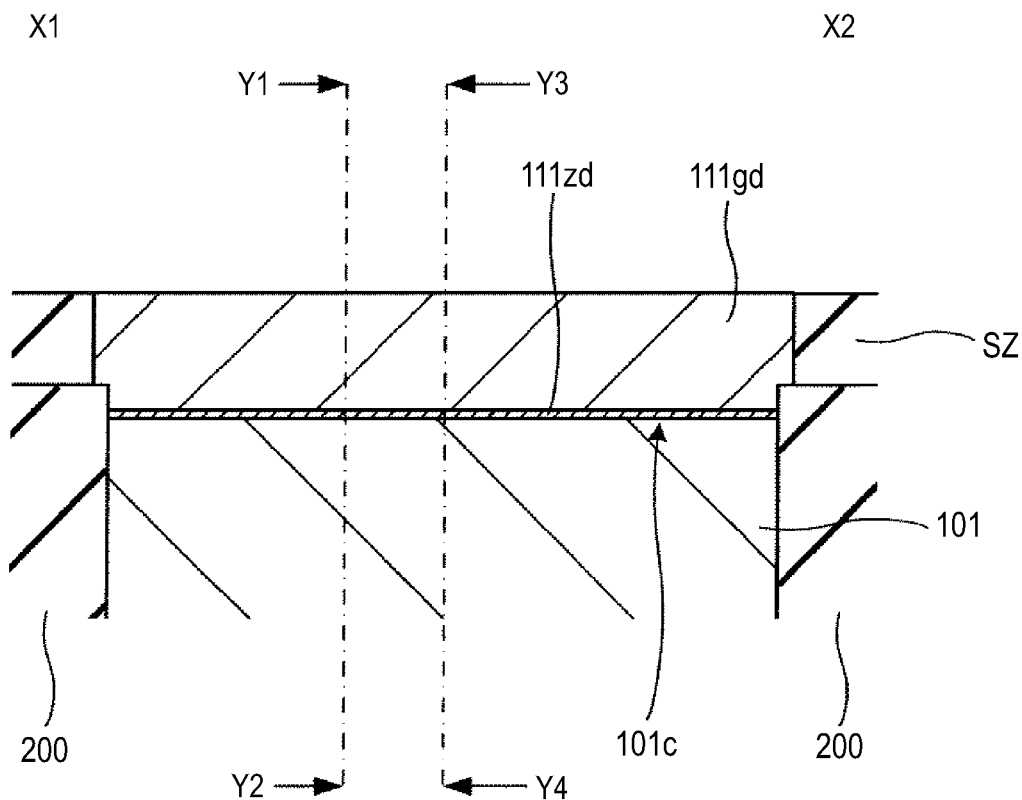
FIG. 7 is a diagram illustrating a relevant portion of the semiconductor component in one of the steps of a manufacturing method according to First Embodiment of the present invention.
Figure 7:
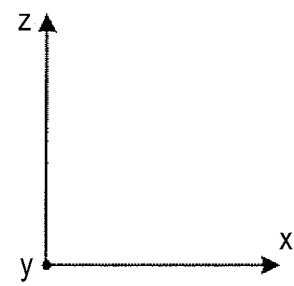
Figure 8A:
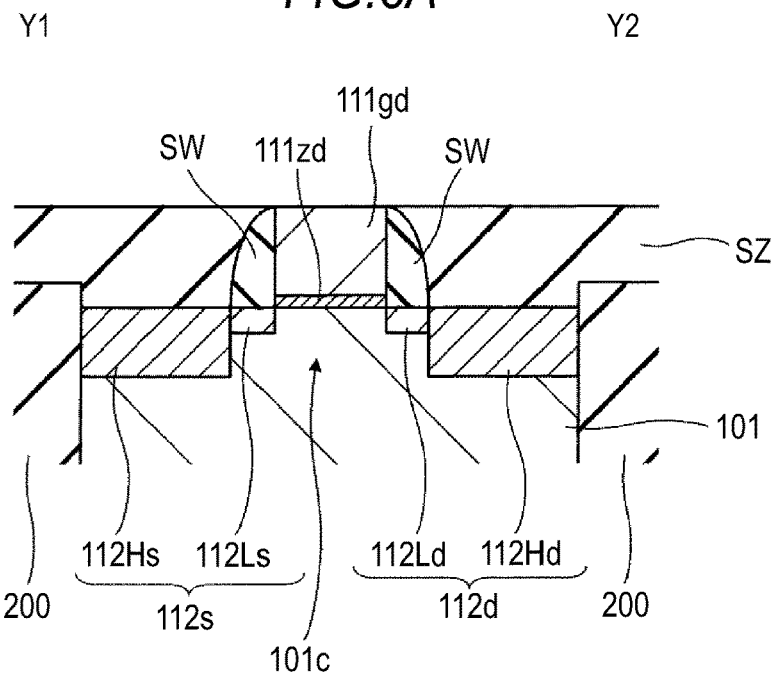
FIGS. 8A and 8B are diagrams illustrating a relevant portion of the semiconductor component in one of the steps of the manufacturing method according to First Embodiment of the present invention.
Figure 8B:
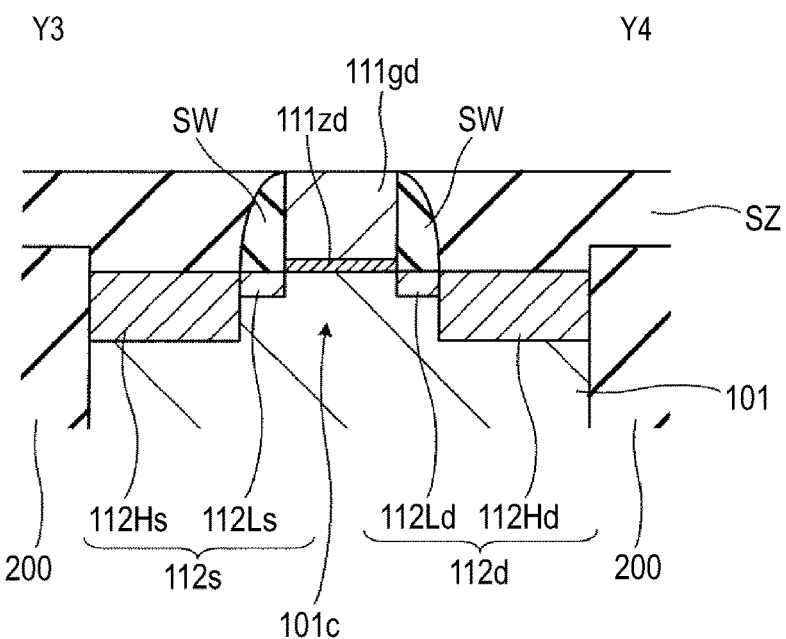
Figure 8B:
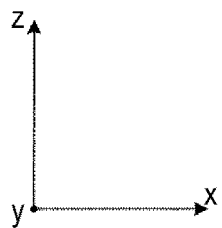

Thereafter, as illustrated in FIG. 7 and FIGS. 8A and 8B, a planarizing film forming step is performed.

As illustrated in FIG. 7 and FIGS. 8A and 8B, a planarizing film SZ is formed on the surface of the semiconductor substrate 101.

In this step, the planarizing film SZ is formed on the surface of the semiconductor substrate 101 in such a manner as to expose the top surface of the dummy gate electrode 111gd in the transistor Tr formed in the previous step, and to cover the other portions.

Specifically, first, a silicon oxide film (not illustrated) is formed on the surface of the semiconductor substrate 101 so as to cover the transistor Tr. Then, for example, a CMP (Chemical Mechanical Polish) process is performed on the silicon oxide film (not illustrated) until the top surface of the dummy gate electrode 111gd is exposed. As a result, the planarizing film SZ is formed, as illustrated in FIG. 7 and FIGS. 8A and 8B.

(3) Dummy Gate Electrode and Dummy Gate Insulating Film Removing Step

Figure 9:
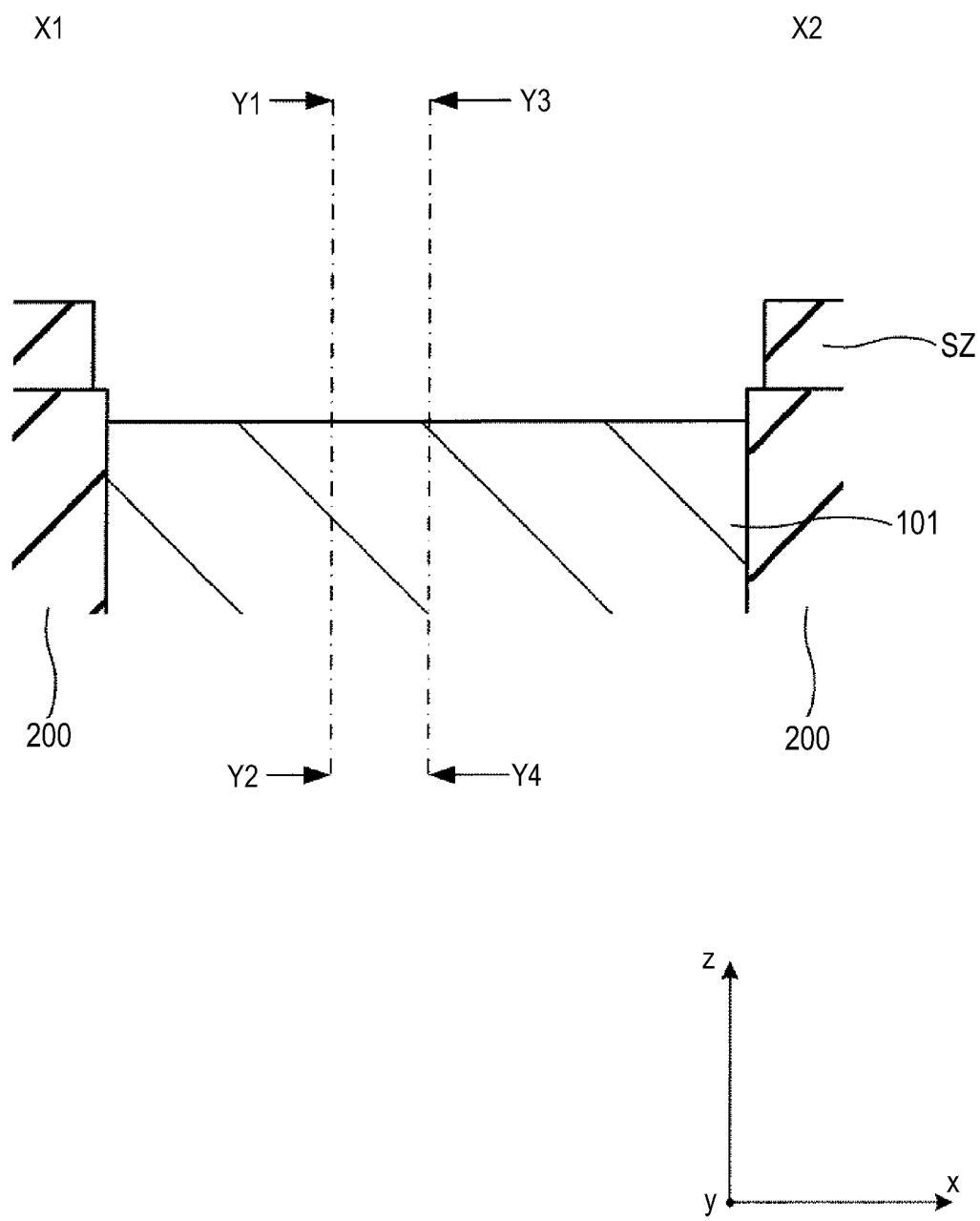
FIG. 9 is a diagram illustrating a relevant portion of the semiconductor component in one of the steps of a manufacturing method according to First Embodiment of the present invention.
Figure 10A:
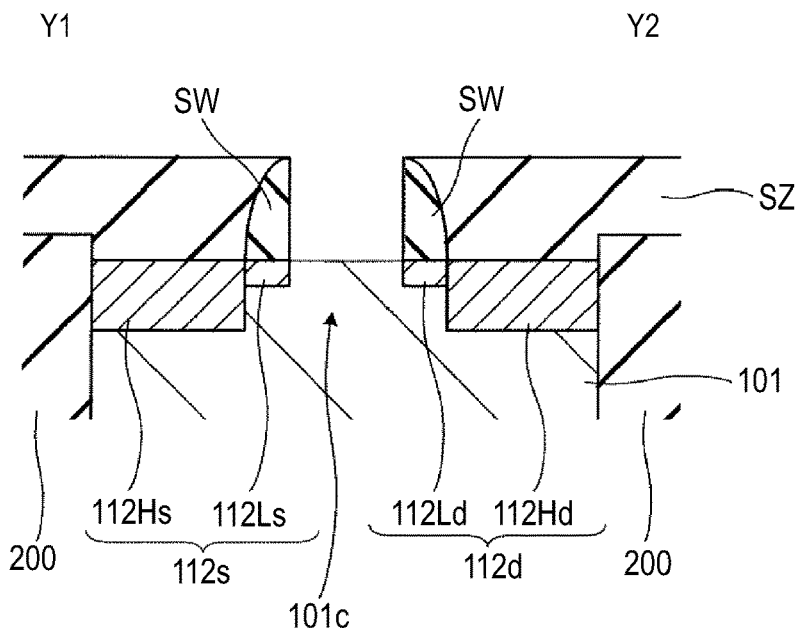
FIGS. 10A and 10B are diagrams illustrating a relevant portion of the semiconductor component in one of the steps of the manufacturing method according to First Embodiment of the present invention.
Figure 10B:
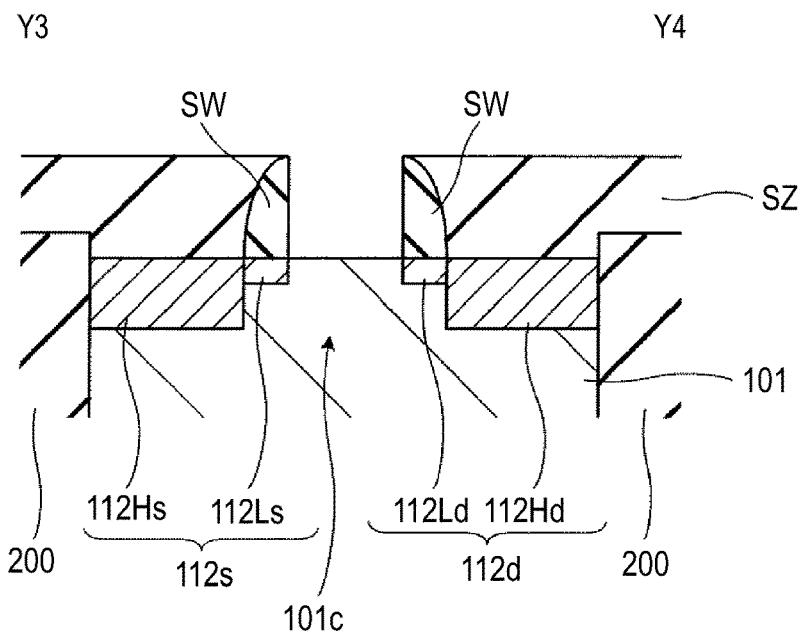
Figure 10B:
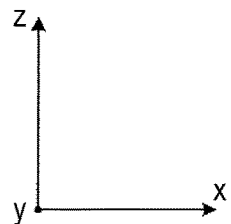

Thereafter, as illustrated in FIG. 9 and FIGS. 10A and 10B, a dummy gate electrode and dummy gate insulating film removing step is performed.

As illustrated in FIG. 9 and FIGS. 10A and 10B, the dummy gate electrode 111gd and the dummy gate insulating film 111zd of the transistor Tr formed in the previous step are removed. As a result of this step, the surface of the semiconductor substrate 101 that has been covered with the dummy gate electrode 111gd and the dummy gate insulating film 111zd is exposed, and an opening is formed in this surface portion.

Specifically, the dummy gate electrode 111gd is removed first. For example, the dummy gate electrode 111gd is selectively removed by dry etching, using $Cl_2$ gas, HBr gas, and a mixed gas of $Cl_2$ and HBr.

Then, the dummy gate insulating film 111zd is removed. For example, the dummy gate insulating film 111zd is selectively removed by wet etching, using hydrofluoric acid.

The dummy gate electrode 111gd and the dummy gate insulating film 111zd are removed in this manner to expose the surface of the semiconductor substrate 101 between the side walls SW.

(4) Groove Forming Step

Figure 11:
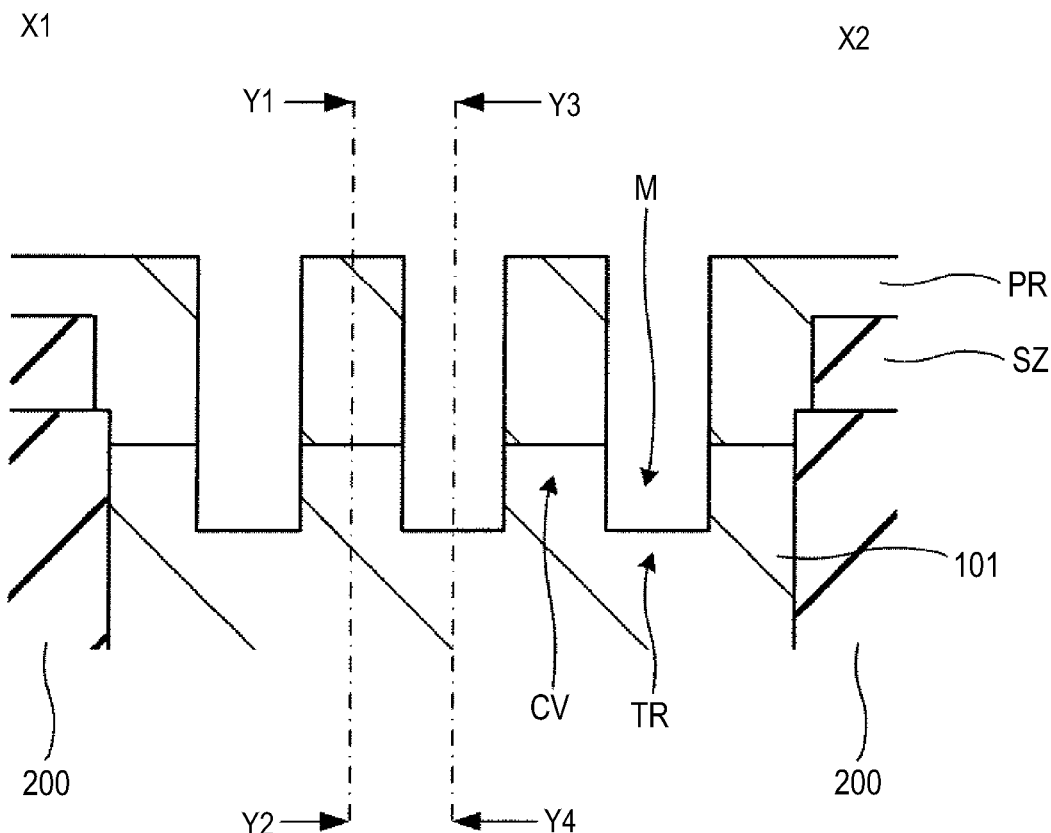
FIG. 11 is a diagram illustrating a relevant portion of the semiconductor component in one of the steps of a manufacturing method according to First Embodiment of the present invention.
Figure 11:
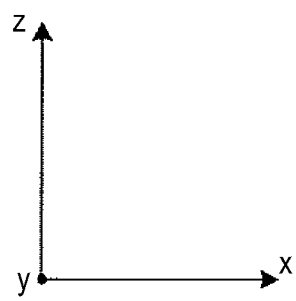
Figure 12A:
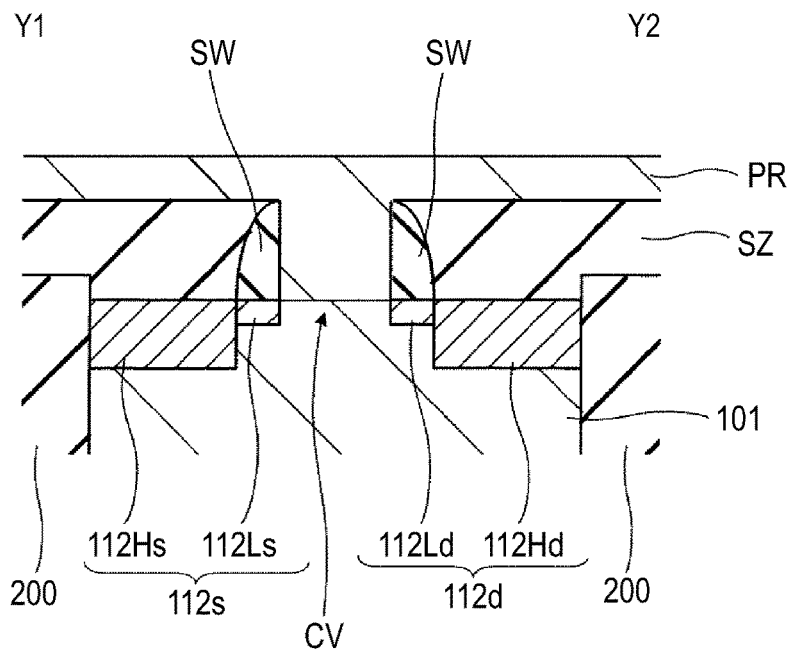
FIGS. 12A and 12B are diagrams illustrating a relevant portion of the semiconductor component in one of the steps of the manufacturing method according to First Embodiment of the present invention.
Figure 12B:
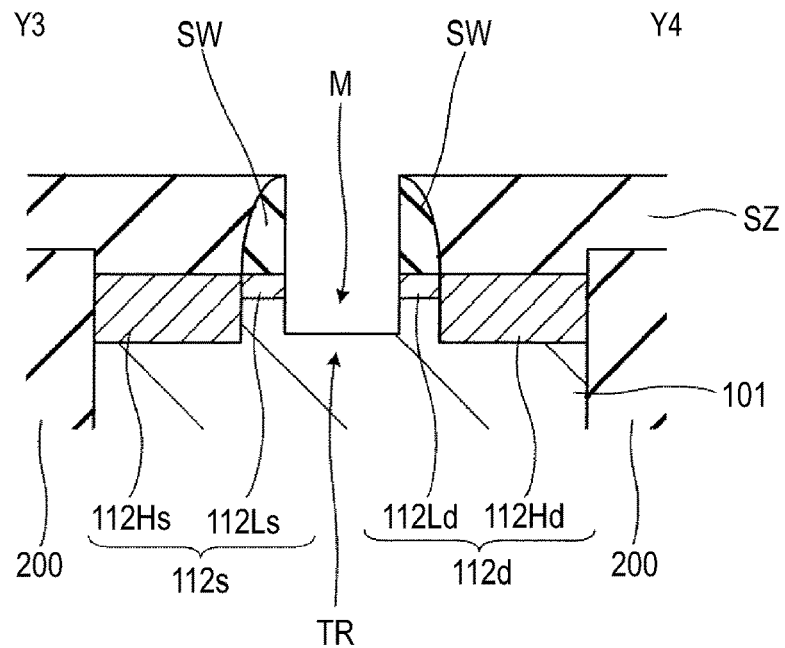
Figure 12B:
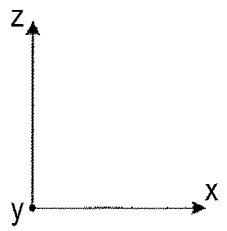

As illustrated in FIG. 11 and FIGS. 12A and 12B, a groove forming step is performed.

As illustrated in FIG. 11 and FIGS. 12A and 12B, the grooves M are formed on the surface of the semiconductor substrate 101.

In this step, the grooves M are provided on the surface of the semiconductor substrate 101 by etching the opening surface of the semiconductor substrate 101. As a result, the patterned surface is formed on the surface of the semiconductor substrate 101.

Specifically, as illustrated in FIG. 11 and FIGS. 12A and 12B, a resist pattern PR is formed. The resist pattern PR is formed so as to cover the surface of the semiconductor substrate 101 where the raised portions CV are to be formed, and to expose the surface where the recessed portions TR are to be formed. In other words, though not illustrated, the resist pattern PR is formed to include portions that extend in stripes along the channel length direction y on the top surface.

Then, the semiconductor substrate 101 is etched to form the grooves M on the semiconductor substrate 101, using the resist pattern PR as a mask. For example, the grooves M are formed at a depth of about 30 to 60 nm by dry etching using a mixed gas of $Cl_2$ and $O_2$. Then, by a post process using hydrofluoric acid, the damaged layer (not illustrated) created by the etching is removed, followed by the removal of the resist pattern PR.

As a result, the raised portions CV and the recessed portions TR are formed on the surface of the semiconductor substrate 101, rendering the surface patterned.

(5) High-Dielectric Film Forming Step

Figure 13:
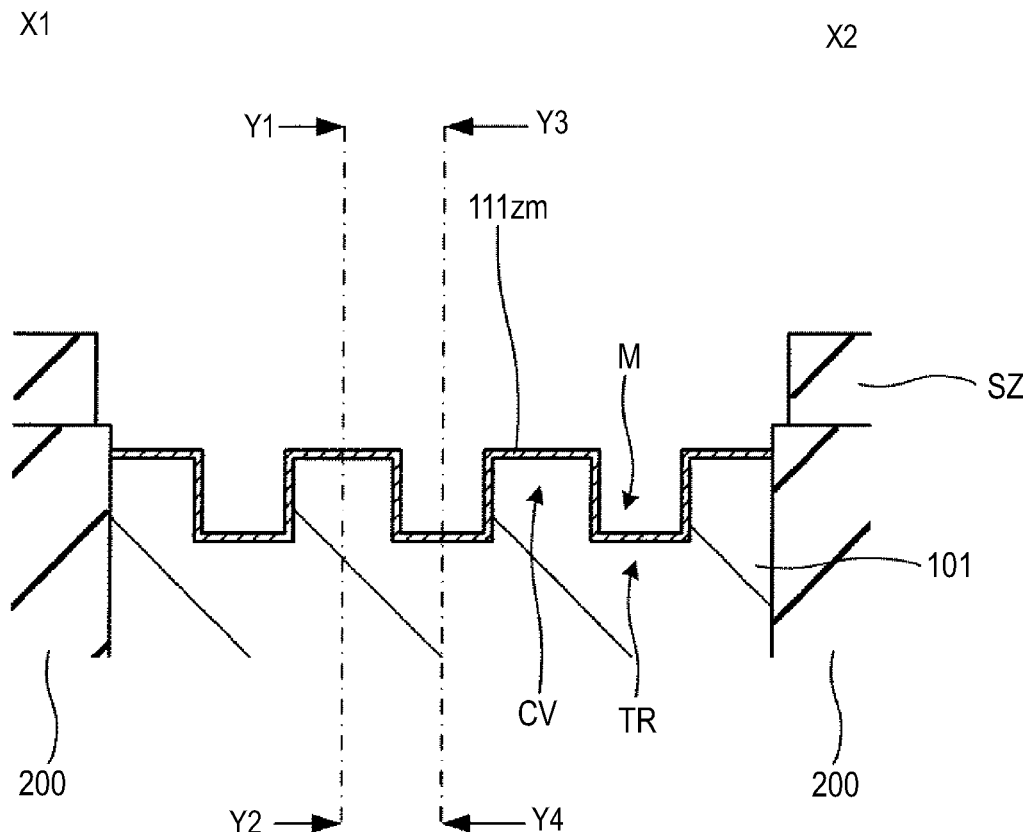
FIG. 13 is a diagram illustrating a relevant portion of the semiconductor component in one of the steps of a manufacturing method according to First Embodiment of the present invention.
Figure 13:
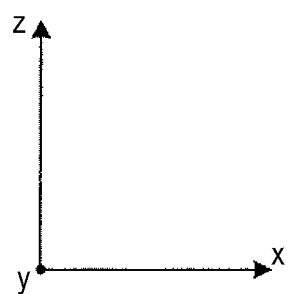
Figure 14A:
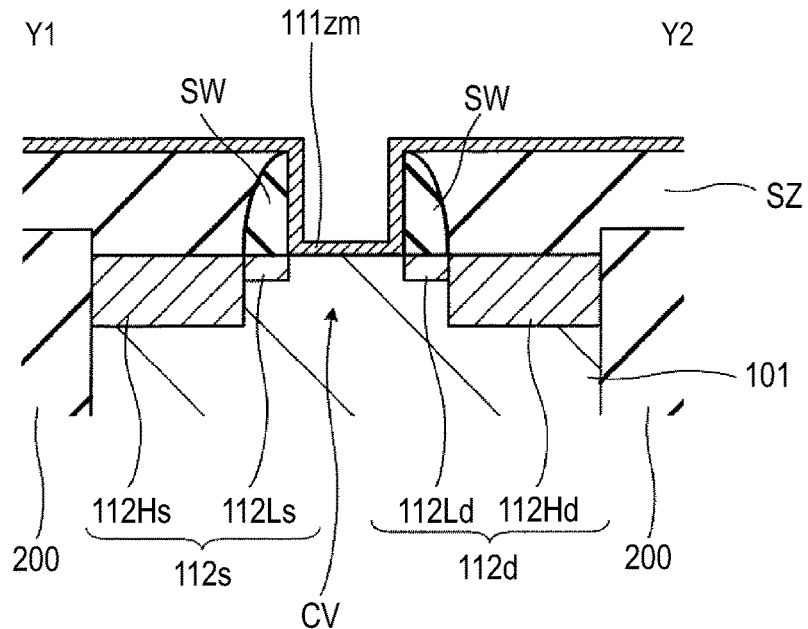
FIGS. 14A and 14B are diagrams illustrating a relevant portion of the semiconductor component in one of the steps of the manufacturing method according to First Embodiment of the present invention.
Figure 14B:
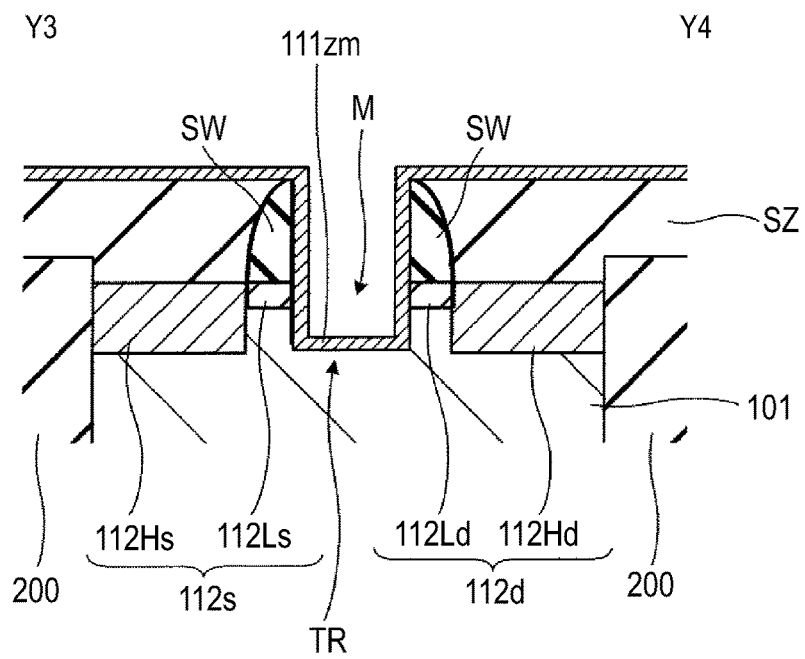
Figure 14B:
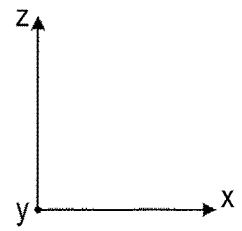

As illustrated in FIG. 13 and FIGS. 14A and 14B, a high-dielectric film forming step is performed.

As illustrated in FIG. 13 and FIGS. 14A and 14B, a high-dielectric film 111zm is deposited so as to cover the patterned surface of the semiconductor substrate 101. In the present embodiment, the high-dielectric film 111zm is formed to cover not only the patterned surface of the semiconductor substrate 101, but the top surface of the planarizing film SZ and the opposing side surfaces of the side walls SW.

Specifically, as illustrated in FIG. 13, the high-dielectric film 111zm is formed so as to cover the surfaces of the raised portions CV and the recessed portions TR on the semiconductor substrate 101. As a result, as illustrated in FIG. 14A, the high-dielectric film 111zm covers the top surface of the raised portions CV. In the recessed portions TR, as illustrated in FIG. 14B, the high-dielectric film 111zm covers the bottom and side surfaces of the grooves M formed on the semiconductor substrate 101.

The high-dielectric film 111zm is formed by, for example, depositing high-dielectric material such as those exemplified above, using a CVD method or an ALD method. For example, a 2-nm thick hafnium oxide film is formed as the high-dielectric film 111zm. Specifically, the hafnium oxide film is formed by a CVD method, using $HfCl_2$ and $NH_3$. The hafnium oxide film may be formed by a CVD method, using an organic Hf gas.

(6) Metal Film Forming Step

Figure 15:
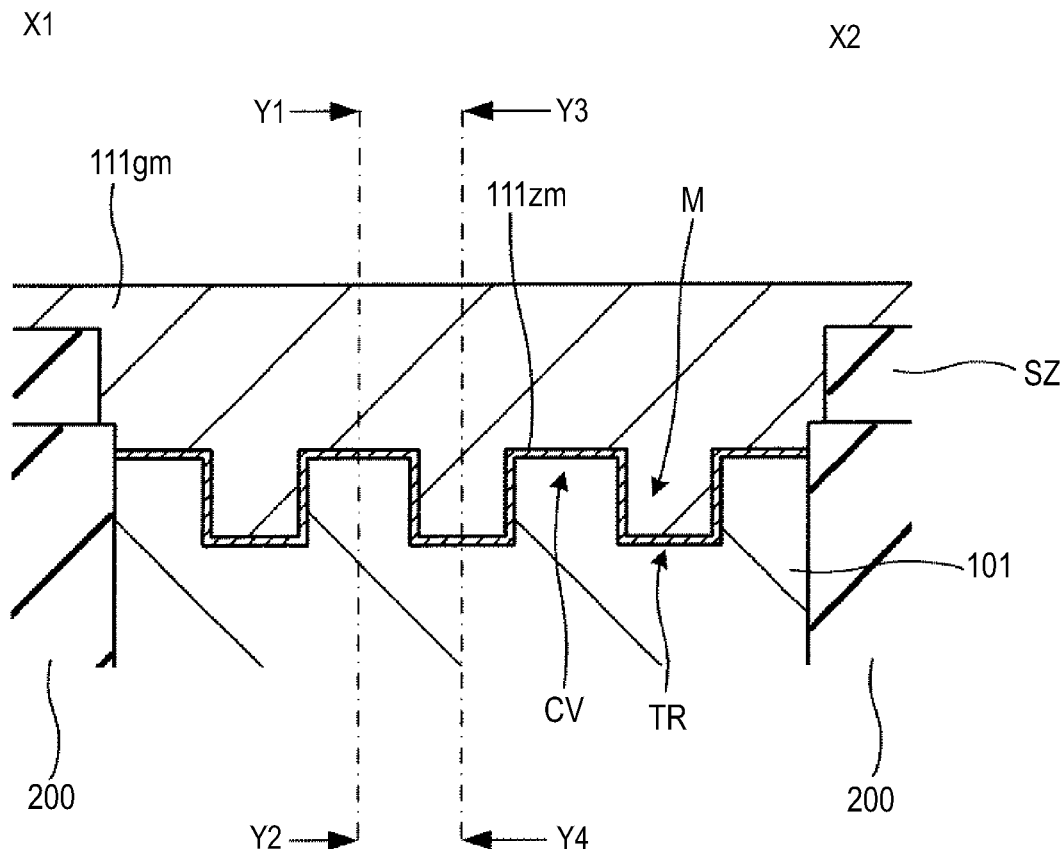
FIG. 15 is a diagram illustrating a relevant portion of the semiconductor component in one of the steps of a manufacturing method according to First Embodiment of the present invention.
Figure 15:
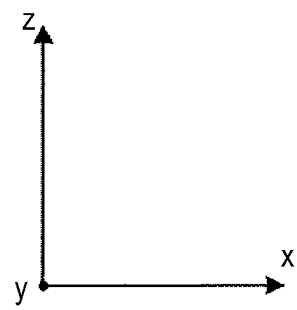
Figure 16A:
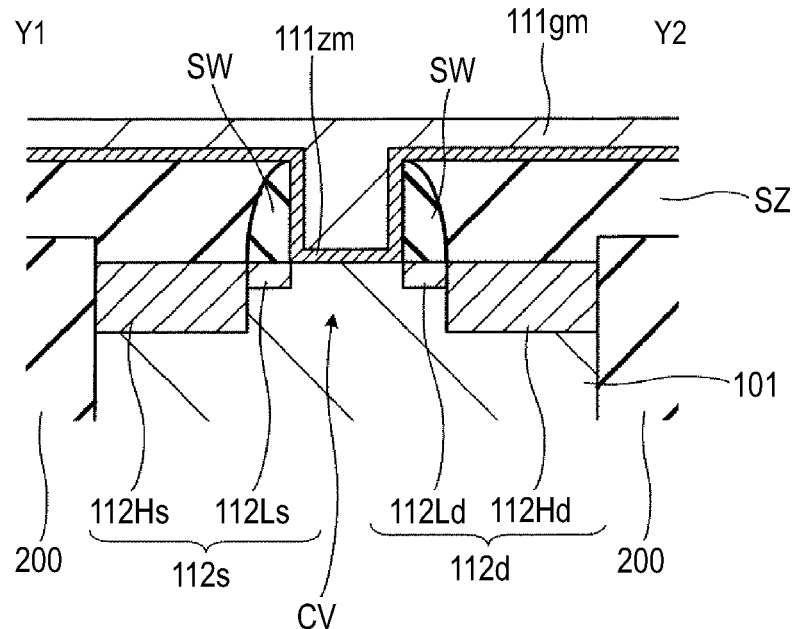
FIGS. 16A and 16B are diagrams illustrating a relevant portion of the semiconductor component in one of the steps of the manufacturing method according to First Embodiment of the present invention.
Figure 16B:
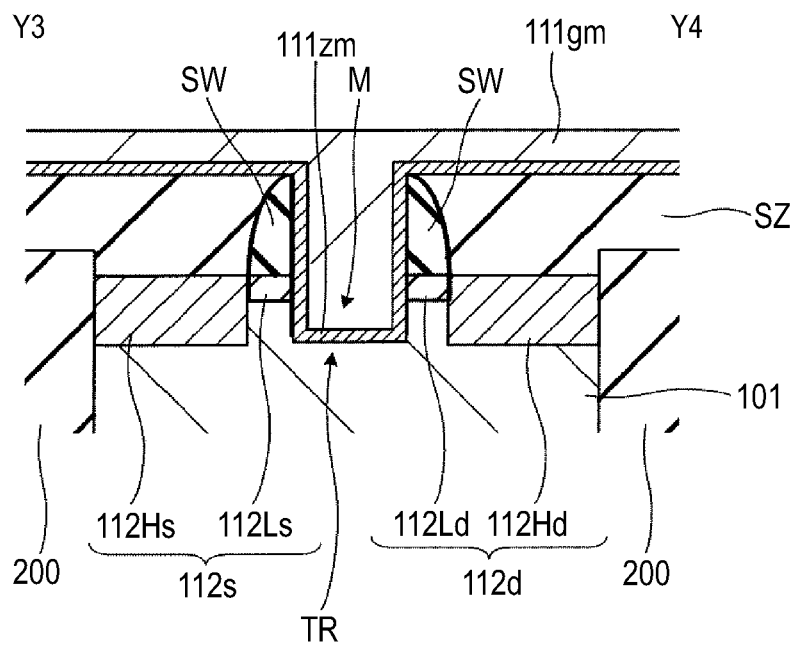

As illustrated in FIG. 15 and FIGS. 16A and 16B, a metal film forming step is performed.

As illustrated in FIG. 15 and FIGS. 16A and 16B, a metal film 111gm is formed so as to cover the patterned surface of the semiconductor substrate 101, the top surface of the planarizing film SZ, and the opposing side surfaces of the side walls SW, via the high-dielectric film 111zm.

Specifically, as illustrated in FIG. 15, the metal film 111gm is formed so as to cover the surfaces of the raised portions CV and the recessed portions TR on the semiconductor substrate 101 via the high-dielectric film 111zm. As a result, as illustrated in FIG. 16A, the metal film 111gm in the raised portions CV covers the top surface via the high-dielectric film 111zm, and fills the space between the side walls SW. In the recessed portions TR, as illustrated in FIG. 16B, the metal film 111gm covers the bottom and side surfaces of the grooves M on the semiconductor substrate 101 via the high-dielectric film 111zm, and fills the space between the side walls SW.

The metal film 111gm is formed by, for example, depositing metallic material such as those exemplified above, using a sputtering method.

(7) Gate Electrode and Gate Insulating Film Forming Step

As illustrated in FIG. 2 to FIG. 4, a gate electrode and gate insulating film forming step is performed to complete the semiconductor device 110.

The gate electrode 111g and the gate insulating film 111z illustrated in FIG. 2 to FIG. 4 are formed by processing the high-dielectric film 111zm and the metal film 111 gm. In the present embodiment, the gate electrode 111g and the gate insulating film 111z are formed by a planarization process, by which the high-dielectric film 111zm and the metal film 111 gm formed on the planarizing film SZ are removed.

Specifically, the metal film 111gm and the high-dielectric film 111zm are subjected to CMP to expose the top surface of the planarizing film SZ. By sequentially polishing the metal film 111gm and the high-dielectric film 111zm in this manner, the gate electrode 111g and the gate insulating film 111z are formed.

After covering the surface with the interlayer insulating film (not illustrated), the source electrode and the drain electrode (not illustrated) are formed to complete the semiconductor device 110.

(C) Review

As described above, in the present embodiment, the semiconductor device 110 is provided on the semiconductor substrate 101. The semiconductor device 110 is a field-effect transistor, and includes the gate insulating film 111z, the gate electrode 111g, and the source-drain regions 112s and 112d. In the semiconductor device 110, the gate insulating film 111z is formed on the surface of the semiconductor substrate 101. The gate electrode 111g is formed on the surface of the semiconductor substrate 101 via the gate insulating film 111z. The source-drain regions 112s and 112d are provided on the both sides of the gate electrode 111g on the semiconductor substrate 101.

In the present embodiment, the semiconductor substrate 101 has a patterned surface in a portion where the gate electrode 111g is provided. In the raised portions CV on the patterned surface of the semiconductor substrate 101, the gate insulating film 111z is formed to cover the surface of the semiconductor substrate 101 that lies on the same plane as the surface of the source-drain regions 112s and 112d. The gate electrode 111g is formed on the top surface of the gate insulating film 111z. In the recessed portions TR on the patterned surface of the semiconductor substrate 101, the gate insulating film 111z is formed to cover the surfaces of the grooves M formed toward the interior of the semiconductor substrate 101 than the surface of the source-drain regions 112s and 112d. The gate electrode 111g is provided so as to fill the grooves M provided with the gate insulating film 111z. The source-drain regions 112s and 112d are formed in the same shape for the raised portions CV and the recessed portions TR on the patterned surface of the semiconductor substrate 101.

As described above, in the present embodiment, the channel width direction x of the semiconductor device (FET) 110 is along the patterned surface. Thus, the effective channel width can be increased.

Particularly, in the present embodiment, because the side surfaces of the grooves M on the patterned surface of the semiconductor substrate 101 are along the depth direction z of the semiconductor substrate 101, the effective channel width can be effectively increased.

Further, because the channel is formed by the patterned side walls, the S factor can be improved by the same effect provided by the Π gate. Because the recessed portions TR have the same impurity profile as that of the raised S/D structure, the S factor can be further improved by the corner effect.

Thus, low-voltage driving can easily be realized in the present embodiment.

As described above, the gate is formed by a damascene process in the semiconductor device 110. Thus, it is not required to provide a wide patterned surface in the channel length direction y by taking into consideration the alignment of the gate electrode 111g for fabrication.

Specifically, as illustrated in FIG. 1, the patterned shape can be formed in the same width as the channel length as in region TA defined by the width of the gate electrode 111g (the distance defined by y direction), and it is not required to form a wider patterned shape than the channel length. In other words, the surface of the semiconductor substrate 101 is patterned only in the portion directly below the gate electrode 111g.

Specifically, in the raised portions CV and the recessed portions TR, the source-drain regions 112s and 112d have a flat top surface, and the same depth in the semiconductor substrate 101.

Because the surface of the source-drain regions 112s and 112d is not patterned in the present embodiment, the source and drain electrodes (not illustrated) can easily be formed.

Further, miniaturization of the source and drain electrodes can easily be realized along the channel length direction y.

Further, in the present embodiment, because the source-drain regions 112s and 112d are formed before forming the pattern, diffusion of electric field in the recessed portions TR, and the resulting higher off current in the recessed portions TR than in the raised portions CV can be prevented.

Thus, according to the present embodiment, semiconductor device characteristics can be improved, and miniaturization of the semiconductor device can be realized with ease.

2. Second Embodiment

Second Embodiment of the present invention is described below.
(A) Device Configuration, etc.

Figure 17:
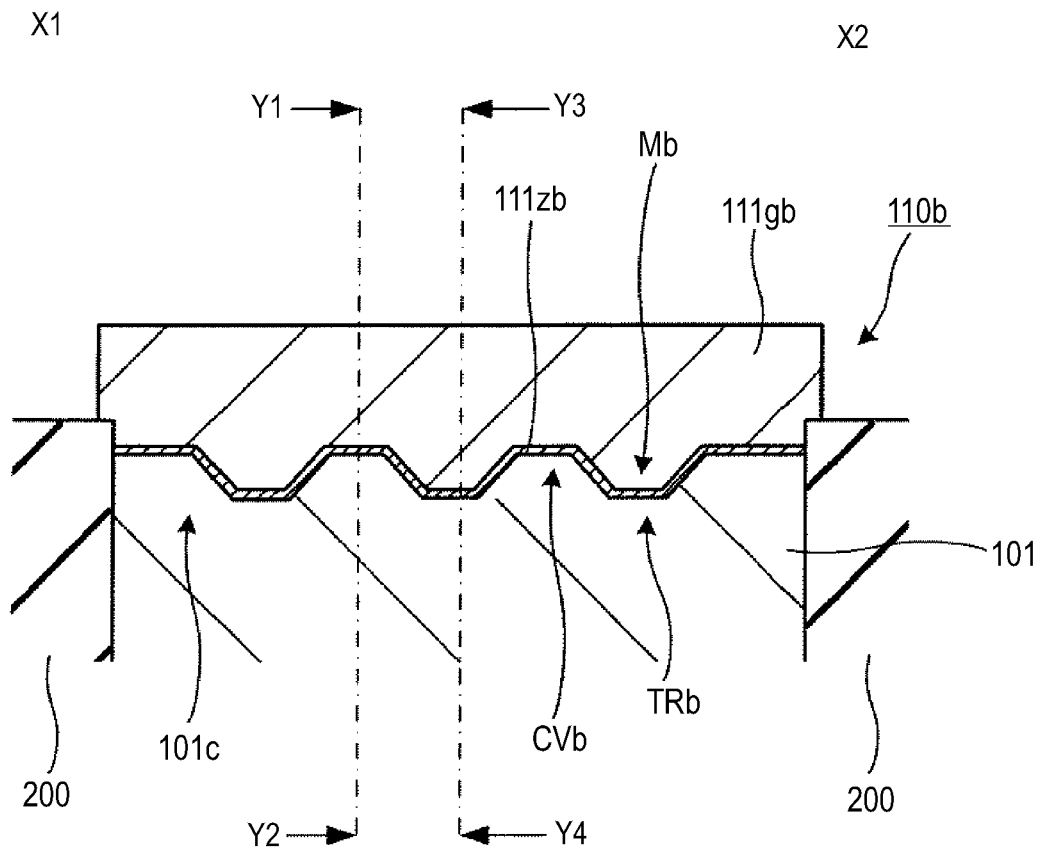
FIG. 17 is a diagram illustrating a semiconductor component according to Second Embodiment of the present invention.
Figure 17:
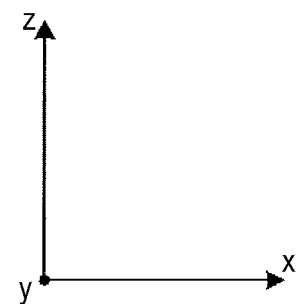

FIG. 17 is a diagram illustrating a semiconductor component 100b according to Second Embodiment of the present invention.

As is FIG. 2, FIG. 17 is a cross section perpendicular to the plane of the paper at X1-X2 of FIG. 1. The cross section perpendicular to the plane of the paper at Y1-Y2 of FIG. 17 is as shown in FIG. 3. The cross section perpendicular to the plane of the paper at Y3-Y4 of FIG. 17 is as shown in FIG. 4.

As illustrated in FIG. 17, the present embodiment differs from First Embodiment in a gate electrode 111gb and a gate insulating film 111zb of the semiconductor device 110b, as illustrated in FIG. 17. The other configuration is the same as in First Embodiment. Accordingly, descriptions will not be repeated for the overlapping parts.

As illustrated in FIG. 17, the semiconductor device 110b is an FET, and includes the gate electrode 111gb, as in First Embodiment.

As illustrated in FIG. 17, the gate electrode 111gb forming the semiconductor device 110b extends in the direction x perpendicular to the channel length direction y. In other words, the gate electrode 111gb is formed so that its longer side is along the channel width direction x.

As illustrated in FIG. 17, the gate electrode 111gb is formed on the surface of the semiconductor substrate 101 via the gate insulating film 111zb.

As illustrated in FIG. 17, the semiconductor substrate 101 has a patterned surface along the longitudinal direction x of the gate electrode 111gb. The gate electrode 111gb is formed so as to cover the patterned surface via the gate insulating film 111zb.

In the present embodiment, as illustrated in FIG. 17, recurrently occurring grooves Mb with slanted side surfaces with respect to the depth direction z of the semiconductor substrate 101 are provided. The grooves Mb have bottom surfaces along the surface (xy plane) of the semiconductor substrate 101, and an opening area that becomes smaller from the surface of the semiconductor substrate 101 downwardly towards inside. Specifically, the grooves Mb on the patterned surface of the semiconductor substrate 101 are formed to include surfaces that are slanted with respect to the depth direction z of the semiconductor substrate 101. The gate electrode 111gb and the gate insulating film 111zb are formed on the surfaces of the raised portions CVb and the recessed portions TRb formed by the grooves Mb.

As in FIG. 3 and FIG. 4 of First Embodiment, the gate electrode 111gb has different cross sectional shapes, and different channel lengths L12 and L34 for the raised portions CVb and the recessed portions TRb. That is, as in First Embodiment, the channel length L34 in the recessed portions TR is longer than the channel length L12 in the raised portions CV in the semiconductor device 110b (see FIG. 3 and FIG. 4).

In the present embodiment, the semiconductor device 110b is formed in the manner described in First Embodiment, except that (4) the groove forming step is different.

Though not illustrated, in (4) the groove forming step of the present embodiment, the resist pattern PR is formed as in First Embodiment (see FIG. 11, and FIGS. 12A and 12B).

The difference from First Embodiment is that the grooves Mb are formed on the semiconductor substrate 101 by digging the (100) plane of the semiconductor substrate 101 and exposing the (111) plane through etching of the semiconductor substrate 101 using the resist pattern PR as a mask. For example, wet etching using an alkaline etchant such as those containing KOH is performed. Specifically, etching is performed to provide the grooves Mb about 30 to 60 nm deep. The resist pattern PR is removed thereafter.

As a result, the raised portions CVb and the recessed portions TRb are formed on the surface of the semiconductor substrate 101, providing the patterned surface.

Subsequently, the (5) high-dielectric film forming step, (6) metal film forming step, and (7) gate electrode and gate insulating film forming step are sequentially performed as in First Embodiment to complete the semiconductor device 110b.
(B) Review As described above, in the present embodiment, the semiconductor device (FET) 110b has the patterned shape formed along the channel width direction x, as in First Embodiment. In this way, the effective channel width can be increased. Further, because the channel is formed by the patterned shaped side walls, the S factor can be improved by the same effect provided by the Π gate.

Thus, as in First Embodiment, low-voltage driving can easily be realized also in the present embodiment.

Further, because the gate is formed by a damascene process as in First Embodiment, the effects described in First Embodiment can be desirably obtained also in this embodiment.

Thus, according to the present embodiment, semiconductor device characteristics can be improved, and miniaturization of the semiconductor device can be realized with ease.
(C) Variation The foregoing embodiment described the grooves Mb with the bottom surfaces being horizontal to the surface (xy plane) of the semiconductor substrate 101, as illustrated in FIG. 17. However, the invention is not limited to this.

Figure 18:
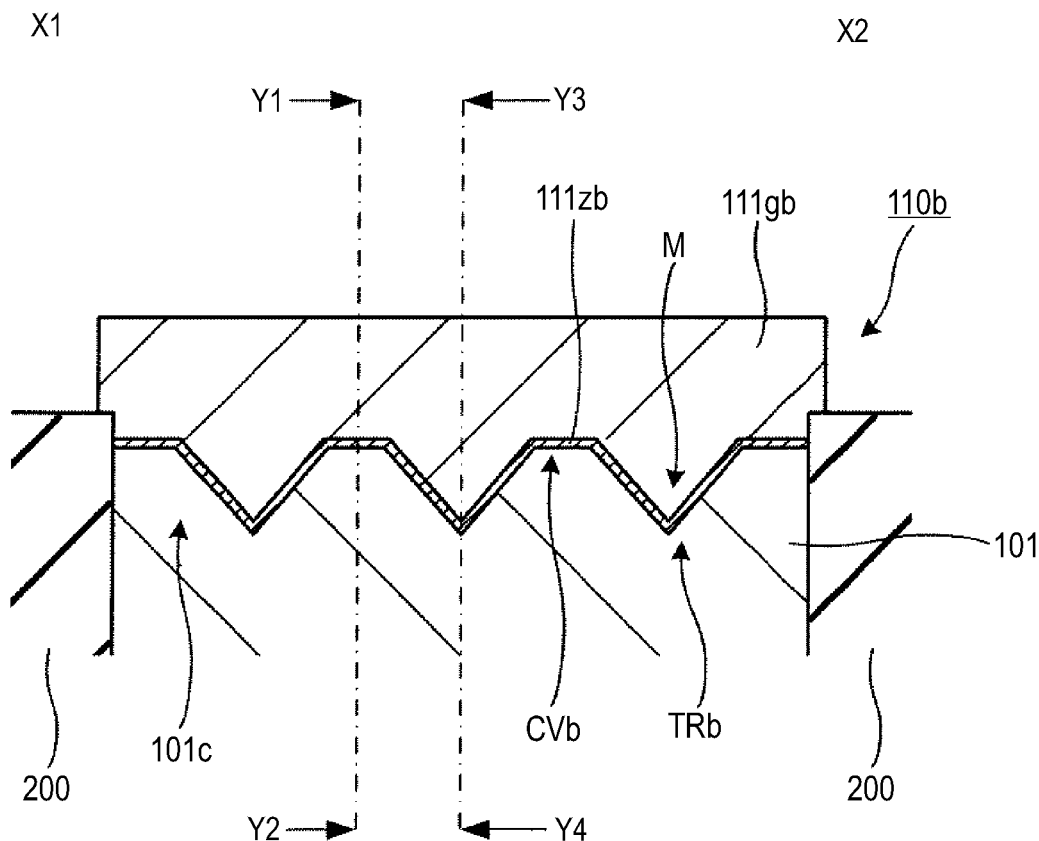
FIG. 18 is a diagram illustrating a variation of the semiconductor component according to Second Embodiment of the present invention.
Figure 18:
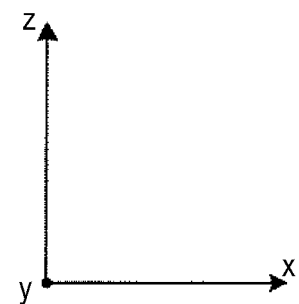

FIG. 18 is a diagram illustrating a variation of the semiconductor component 100b according to Second Embodiment of the present invention.

As is FIG. 17, FIG. 18 is a cross section perpendicular to the plane of the paper at X1-X2 of FIG. 1. The cross section perpendicular to the plane of the paper at Y1-Y2 of FIG. 18 is as shown in FIG. 3. The cross section perpendicular to the plane of the paper at Y3-Y4 of FIG. 18 is as shown in FIG. 4.

As illustrated in FIG. 18, the grooves Mb may be formed in such a manner that, instead of the bottom surface, the slanted surfaces with respect to the surface (xy plane) of the semiconductor substrate 101 intersect at the bottom. Specifically, the grooves Mb may be formed to have a triangular cross section, instead of being tapered.
<3. Other>

The present invention is not limited to the foregoing embodiments, and may be varied in many ways.

Figure 19A:
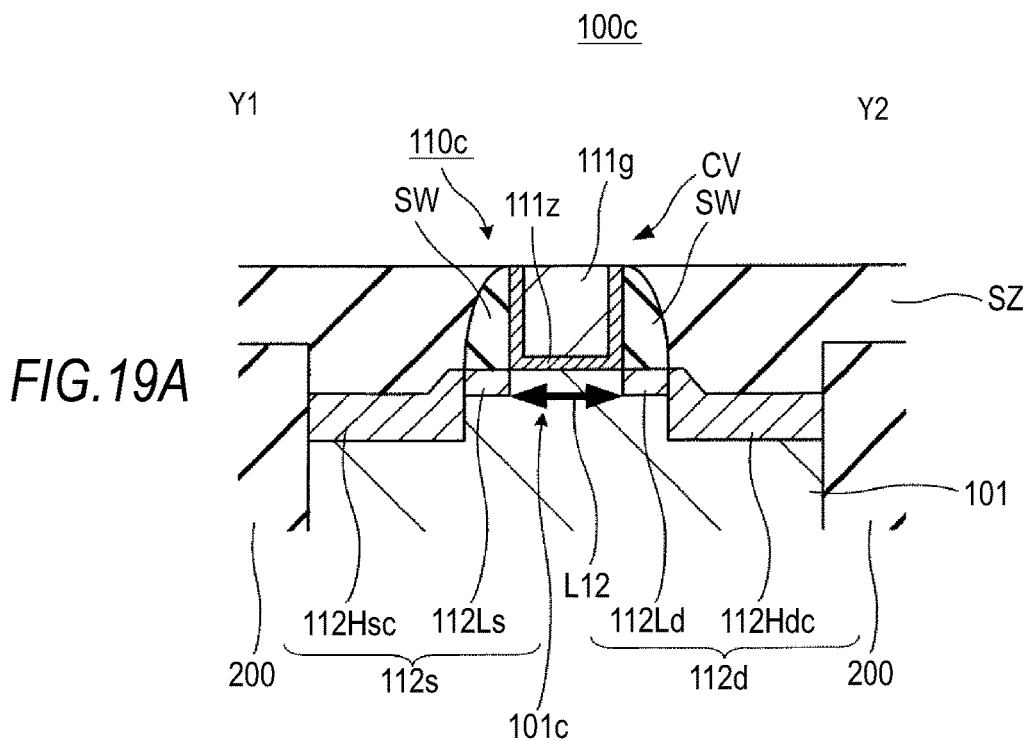
FIGS. 19A and 19B are diagrams illustrating a semiconductor component according to an embodiment of the present invention.
Figure 19B:
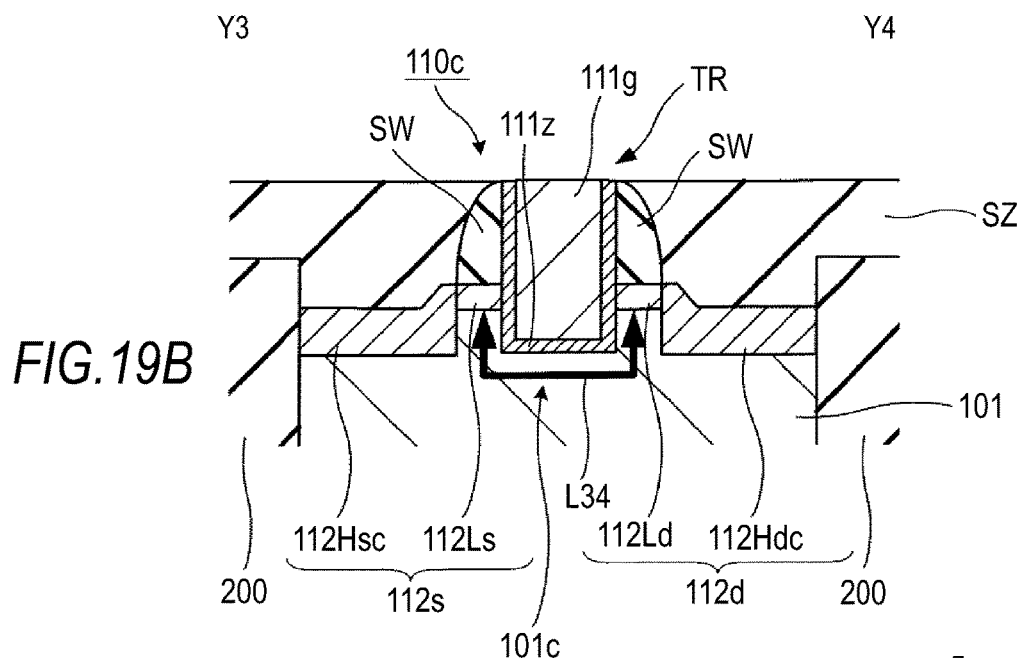

FIGS. 19A and 19B are diagrams illustrating a semiconductor component 100c according to an embodiment of the present invention.

As illustrated in FIGS. 19A and 19B, the source-drain regions 112s and 112d may be formed so that the level of its top surface is partly below the surface of the semiconductor substrate 101 provided with the gate insulating film 111z. Specifically, the source-drain regions 112s and 112d may be formed so that the top surface of the high-concentration impurity regions 112Hs and 112Hd is below the surface of the semiconductor substrate 101 provided with the gate insulating film 111z.

In this case, the top surface of the high-concentration impurity regions 112Hs and 112Hd is partially removed in (1) the transistor forming step of First Embodiment. Subsequently, the steps described in First Embodiment are performed to form the semiconductor component 100c.

Figure 20A:
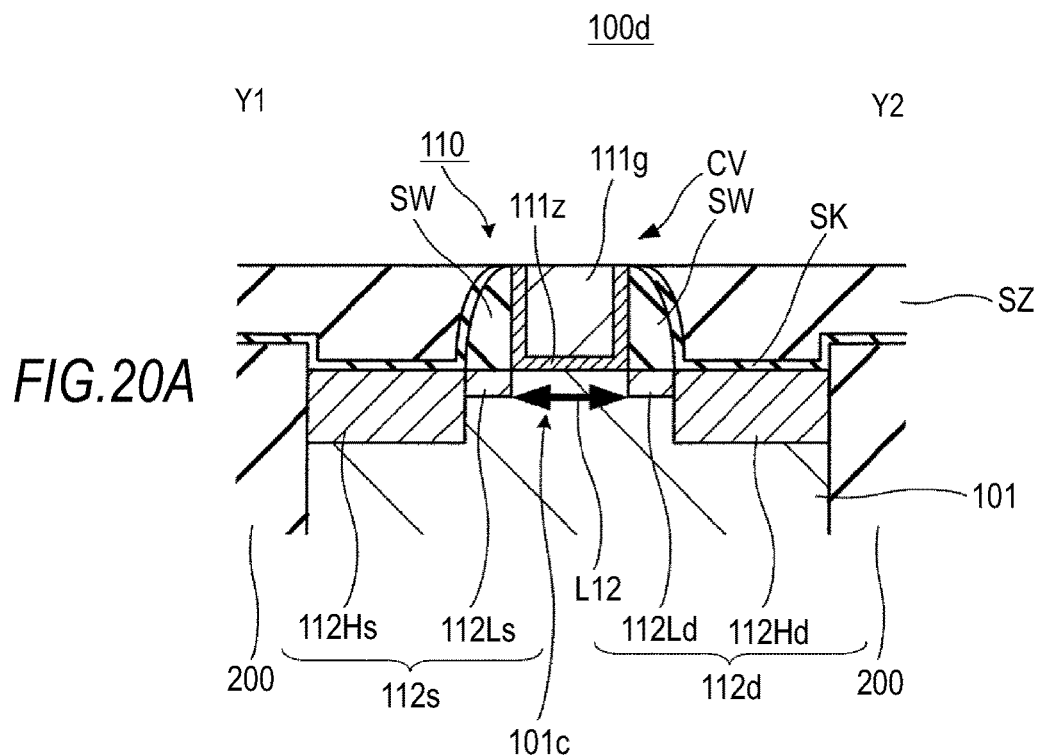
FIGS. 20A and 20B are diagrams illustrating a semiconductor component according to an embodiment of the present invention.
Figure 20B:
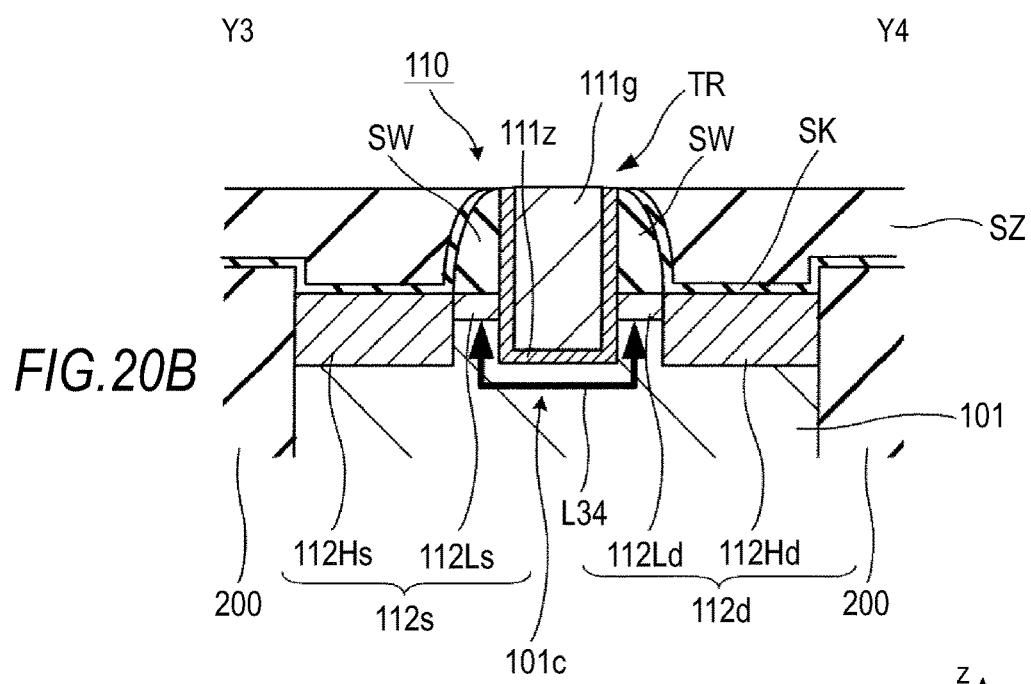
Figure 21:
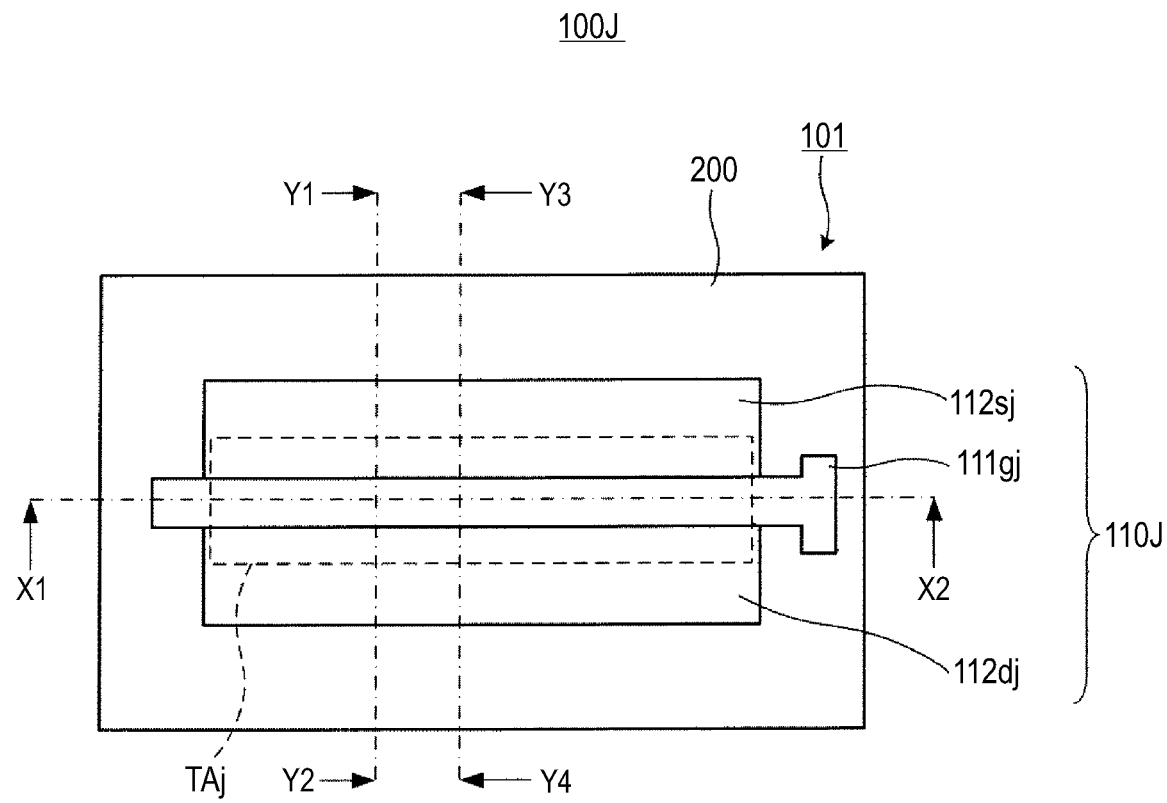
FIG. 21 is a diagram illustrating a semiconductor component.
Figure 22:
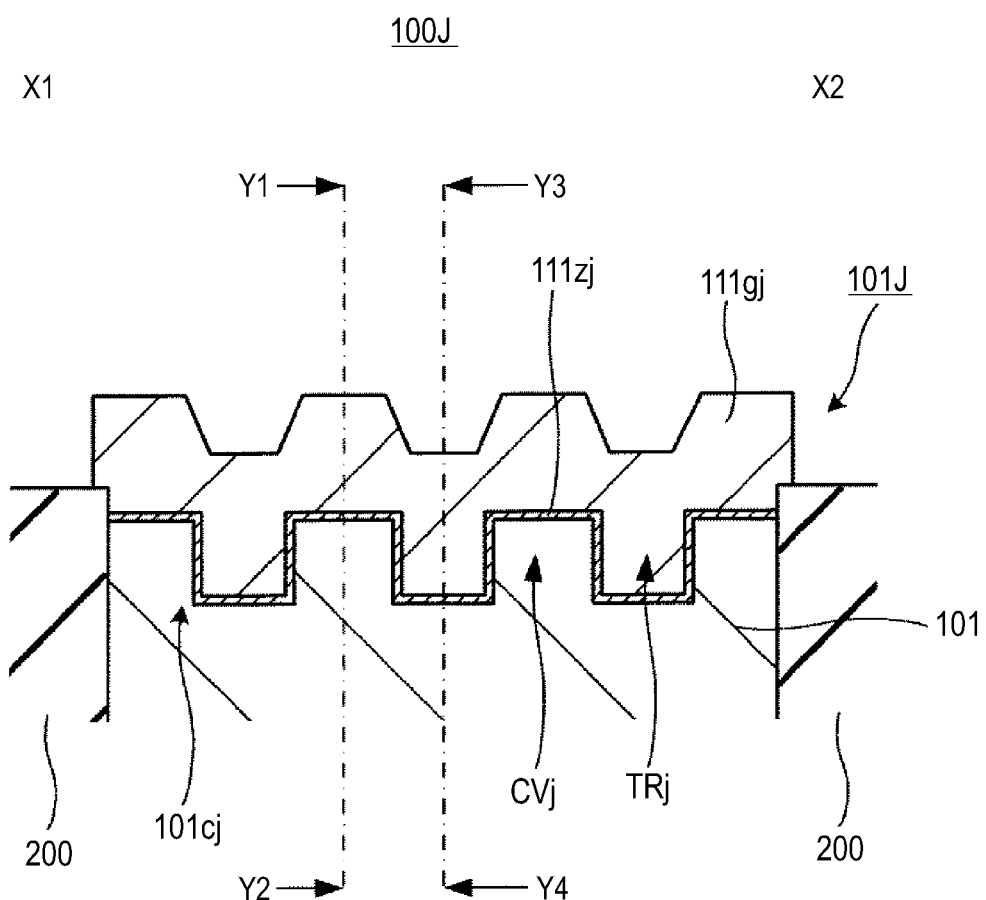
FIG. 22 is a diagram illustrating the semiconductor component.
Figure 23:
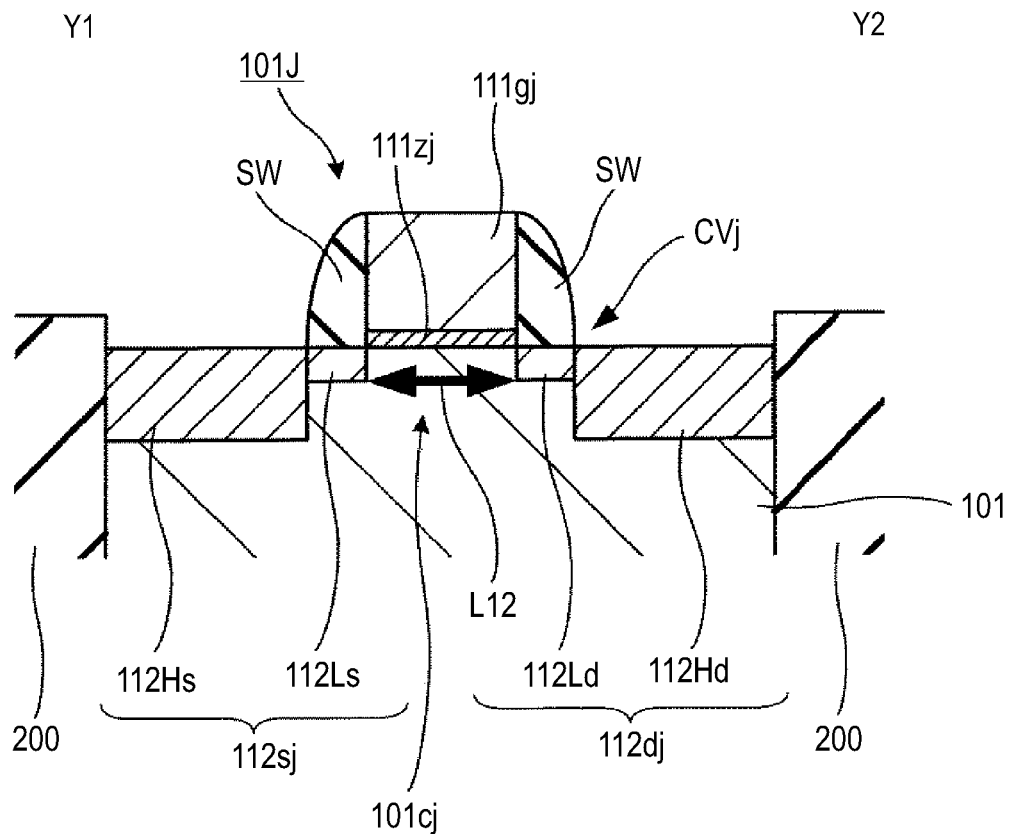
FIG. 23 is a diagram illustrating the semiconductor component.
Figure 23:
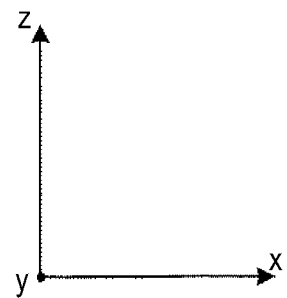
Figure 24:
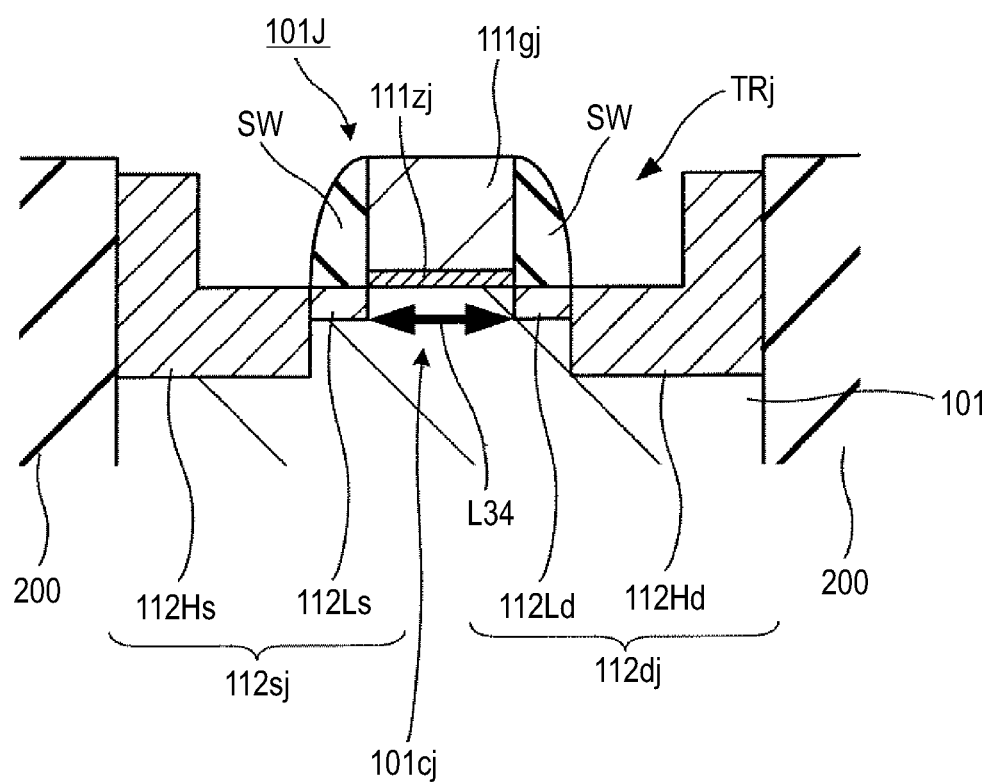
FIG. 24 is a diagram illustrating the semiconductor component.
Figure 24:
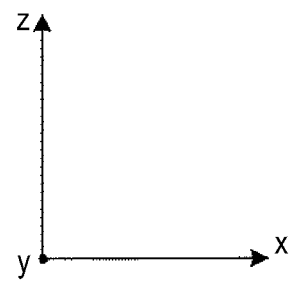

FIGS. 20A and 20B are diagrams illustrating a semiconductor component 100d according to an embodiment of the present invention.

As illustrated in FIGS. 20A and 20B, a stress applying layer SK may be formed so as to cover the top surface of the source-drain regions 112s and 112d. For example, the stress applying layer SK may be formed so as to cover the top surface of the high-concentration impurity regions 112Hs and 112Hd of the source-drain regions 112s and 112d. The stress applying layer SK is, for example, an insulating film such as a silicon nitride film, and is formed to apply stress to the channel of the semiconductor device 110, and thus to improve carrier mobility. The stress applying layer SK is formed using a material appropriately selected to apply tensile stress, when the semiconductor device (FET) 110 is an n-type MOS transistor. When the semiconductor device (FET) 110 is a p-type MOS transistor, a material appropriately selected to apply compressional stress is used to form the stress applying layer SK.

In this case, the stress applying layer SK is formed so as to cover the components of the transistor Tr in (1) the transistor forming step of First Embodiment. Subsequently, the steps described in First Embodiment are performed to form the semiconductor component 100d.

Instead of the insulating film, a silicide film (not illustrated) that covers the top surface of the high-concentration impurity regions 112Hs and 112Hd may be formed as the stress applying layer SK.

The semiconductor components 100, 100b, 100c, and 100d of the foregoing embodiments correspond to semiconductor components according to embodiments of the present invention. The semiconductor substrate 101 of the foregoing embodiments corresponds to a semiconductor substrate according to an embodiment of the present invention. The semiconductor devices 110 and 110b of the foregoing embodiments correspond to semiconductor devices according to embodiments of the present invention. The gate electrodes 111g and 111gb of the foregoing embodiments correspond to gate electrodes according to embodiments of the present invention. The dummy gate electrode 111gd of the foregoing embodiments corresponds to a dummy gate electrode according to an embodiment of the present invention. The metal film 111gm of the foregoing embodiments corresponds to a conductive film according to an embodiment of the present invention. The gate insulating films 111z and 111zb of the foregoing embodiments correspond to gate insulating films according to embodiments of the present invention. The dummy gate insulating film 111zd of the foregoing embodiments corresponds to a dummy gate insulating film according to an embodiment of the present invention. The high-dielectric film 111zm of the foregoing embodiments corresponds to an insulating film according to an embodiment of the present invention. The source-drain regions 112d and 112s of the foregoing embodiments correspond to source-drain regions according to embodiments of the present invention. The raised portions CV and CVb of the foregoing embodiments correspond to raised portions according to embodiments of the present invention. The grooves M and Mb of the foregoing embodiments correspond to grooves according to embodiments of the present invention. The planarizing film SZ of the foregoing embodiments corresponds to a planarizing film according to an embodiment of the present invention. The recessed portions TR and TRb of the foregoing embodiments correspond to recessed portions according to embodiments of the present invention.

The present application contains subject matter related to that disclosed in Japanese Priority Patent Application JP 2009-298319 filed in the Japan Patent Office on Dec. 28, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
a semiconductor substrate; and
a transistor arranged on the semiconductor substrate, the transistor including a gate insulating film on the semiconductor substrate, a gate electrode arranged above the gate insulating film, and first and second source-drain regions on opposing sides of the gate electrode, wherein
the semiconductor substrate includes a repeating patterned surface in a portion corresponding to the gate electrode,
the patterned surface includes raised portions that respectively have upper surfaces, the upper surfaces of the raised portions extending in a horizontal direction in a cross sectional view, the gate insulating film covering the upper surfaces of the raised portions,
the patterned surface includes recessed portions where the gate insulating film covers surfaces of respective grooves, the surfaces of the grooves extending in the horizontal direction in the cross sectional view,
the patterned surface extends between a first element isolation region and a second element isolation region,
the upper surfaces of the raised portions are lower than upper surfaces of the first and second isolation regions,
the gate electrode fills the groove,
the gate electrode includes a metal material, and
the first and second source-drain regions respectively include low concentration impurity regions and high concentration impurity regions.

2. The semiconductor device according to claim 1, wherein the grooves respectively have a side surface along a depth direction of the semiconductor substrate.

3. The semiconductor device according to claim 1, wherein the grooves respectively have a surface slanted with respect to a depth direction of the semiconductor substrate.

4. The semiconductor device according to claim 1, wherein the first and second source-drain regions have a same shape corresponding to the raised portions and the recessed portions of the patterned surface.

5. The semiconductor device according to claim 1, wherein the first and second source-drain regions have a flat top surface, and have a same depth into the semiconductor substrate corresponding to the raised portions and the recessed portions of the patterned surface.

6. The semiconductor device according to claim 1, wherein the raised portions and the recessed portions are spaced at a same pitch between the first and second isolation regions.

7. The semiconductor device according to claim 1, wherein the repeating patterned surface is rectangularly shaped.

* * * * *